United States Patent
Asai

(10) Patent No.: US 8,132,139 B2
(45) Date of Patent: Mar. 6, 2012

(54) METHOD OF DESIGNING SEMICONDUCTOR DEVICE AND DESIGN PROGRAM

(75) Inventor: Yoshihiko Asai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 246 days.

(21) Appl. No.: 12/688,101

(22) Filed: Jan. 15, 2010

(65) Prior Publication Data

US 2010/0180241 A1   Jul. 15, 2010

(30) Foreign Application Priority Data

Jan. 15, 2009   (JP) .................................. 2009-006503

(51) Int. Cl.
*G06F 17/50* (2006.01)
(52) U.S. Cl. ........ 716/115; 716/106; 716/108; 716/111; 716/113; 716/134
(58) Field of Classification Search .................. 716/106, 716/108, 111, 113, 115, 134
See application file for complete search history.

(56) References Cited

U.S. PATENT DOCUMENTS

| 7,475,377 | B2 | 1/2009 | Yamada | |
|---|---|---|---|---|
| 2006/0152958 | A1* | 7/2006 | Ostermayr et al. | ............. 365/94 |
| 2006/0190876 | A1 | 8/2006 | Yamada | |
| 2007/0143723 | A1 | 6/2007 | Kawakami | |
| 2008/0028353 | A1* | 1/2008 | Lu et al. | ........................... 716/13 |
| 2008/0066025 | A1* | 3/2008 | Tanaka | ............................... 716/4 |
| 2008/0178134 | A1* | 7/2008 | Akamine et al. | ................... 716/6 |
| 2008/0263495 | A1 | 10/2008 | Yamada | |
| 2009/0007035 | A1* | 1/2009 | Su et al. | ............................ 716/5 |
| 2009/0070725 | A1 | 3/2009 | Yamada | |

FOREIGN PATENT DOCUMENTS

| JP | 2006-209702 | 8/2006 |
|---|---|---|
| JP | 2007-172258 | 7/2007 |
| JP | 2008-028161 | 2/2008 |

* cited by examiner

*Primary Examiner* — Paul Dinh
*Assistant Examiner* — Nha Nguyen
(74) *Attorney, Agent, or Firm* — Young & Thompson

(57) ABSTRACT

A semiconductor device has an interconnect structure that includes a main interconnection and a contact structure. Parameters contributing to parasitic capacitance and interconnect resistance of the interconnect structure include: main parameters including width/thickness of the main interconnection; and sub parameter. Variation of each parameter from a design value caused by manufacturing variability is represented within a predetermined range. A method of designing the semiconductor device includes: calculating the maximum capacitance value, the minimum capacitance value, the maximum resistance value and the minimum resistance value of the interconnect structure under a condition that respective variation amplitudes of the main parameters do not simultaneously take maximum values and variation of the sub parameter is fixed to a predetermined value; generating a CR-added netlist; and performing operation verification of the semiconductor device by using the CR-added netlist.

8 Claims, 24 Drawing Sheets

Fig. 5

| | No. | | ① | ② | ③ | ④ | ⑤ | ⑥ | ⑦ |
|---|---|---|---|---|---|---|---|---|---|
| V1 AND LOWER | d0 | | | | | | +3σ | -3σ | |
| V1 AND LOWER | t1 | | | | | | +3σ | -3σ | |
| V1 AND LOWER | d1 | | | | | | +3σ | -3σ | |
| M2 | t2 | | | | | | +3σ | -3σ | +3σ |
| M2 | w2 | | | | | | | +3σ | |
| V2 | d2 | | | +3σ | -3σ | +3σ | -3σ | -3σ | -3σ |
| M3 | w3, t3 | | | | | | | | |
| V3 | d3 | | | +3σ | -3σ | +3σ | -3σ | -3σ | -3σ |
| M4 | t4 | | | | | | | | +3σ |
| M4 | w4 | | | | | | | +3σ | |

| M4 | V3 | M3 | V2 | M2 | V1 | M1 | CT | Gate |
|---|---|---|---|---|---|---|---|---|
| -w4, -t4 | -d3 | -w3, -t3 (I0=WD) | -d2 | -w2, -t2 | -d1 | -t1 | -d0 | |

Fig. 13

EXAMPLE OF SETTING OF VARIATION OF EACH PARAMETER

| CONDITION | MAIN w, t | S1 | S2 | S3~Sn | ε |
|---|---|---|---|---|---|
| typ | 0 | 0 | 0 | 0 | 0 |
| $c_{max}$ | $\sqrt{\alpha_w 2 + \alpha_t 2} = 3$ | $-3\sigma_{s1} \times \gamma$ | $-3\sigma_{s2} \times \gamma$ | $+3\sigma_{si} \times \gamma$ | $+3\sigma_\varepsilon$ |
| $c_{min}$ | $\sqrt{\alpha_w 2 + \alpha_t 2} = 3$ | $+3\sigma_{s1} \times \gamma$ | $+3\sigma_{s2} \times \gamma$ | $-3\sigma_{si} \times \gamma$ | $-3\sigma_\varepsilon$ |

Fig. 17

EXAMPLE OF SETTING OF VARIATION OF EACH PARAMETER

| CONDITION | MAIN w, t | CONTACT S2~Sn |
|---|---|---|
| typ | 0 | 0 |
| $R_{max}$ | $\sqrt{\alpha_w 2 + \alpha_t 2} = 3$ | $+3\sigma_{si} \times \gamma$ |
| $R_{min}$ | $\sqrt{\alpha_w 2 + \alpha_t 2} = 3$ | $-3\sigma_{si} \times \gamma$ |

Fig. 19

EXAMPLE OF CR COMBINATION IN CELL NETLIST

|  | I | II | III | IV | V |
|---|---|---|---|---|---|
| WD | $\cdot C_{typ\_wd}$<br>$\cdot R_{typ\_wd}$ | $\cdot C_{max\_wd}$<br>$\cdot R_{min\_wd}$ | $\cdot C_{min\_wd}$<br>$\cdot R_{max\_wd}$ | $\cdot C_{max\_wd}$<br>$\cdot R_{min\_wd}$ | $\cdot C_{min\_wd}$<br>$\cdot R_{max\_wd}$ |
| BIT | $\cdot C_{typ\_bit}$<br>$\cdot R_{typ\_bit}$ | $\cdot C_{max\_bit}$<br>$\cdot R_{min\_bit}$ | $\cdot C_{min\_bit}$<br>$\cdot R_{max\_bit}$ | $\cdot C_{min\_bit}$<br>$\cdot R_{max\_bit}$ | $\cdot C_{max\_bit}$<br>$\cdot R_{min\_bit}$ |

METHOD OF DESIGNING SEMICONDUCTOR DEVICE AND DESIGN PROGRAM

INCORPORATION BY REFERENCE

This application is based upon and claims the benefit of priority from Japanese patent application No. 2009-006503, filed on Jan. 15, 2009, the disclosure of which is incorporated herein in its entirety by reference.

BACKGROUND OF THE INVENTION

1. Field of the Invention

The present invention relates to a design technique for a semiconductor device. In particular, the present invention relates to a design technique for a semiconductor device having a contact structure.

2. Description of Related Art

In a manufacturing process of a semiconductor device, an interconnect structure may not be manufactured as expected. That is, physical parameters such as a width and a thickness of an interconnection, a thickness of an interlayer insulating film and the like may vary from their desired design values. Such manufacturing variability affects delay in a circuit. Thus, even if a designed circuit passes timing verification on a computer, an actual product may malfunction since the manufacturing variability occurs. Therefore, it is desirable to perform the timing verification in consideration of the manufacturing variability (refer, for example, to Japanese Laid-Open Patent Application JP-2007-172258).

Meanwhile, to consider the manufacturing variability during the timing verification means that a condition to be met in the timing verification becomes stricter. As the condition becomes stricter, the timing verification is more likely to result in fail and thus the number of circuit design modification times increases. This causes increase in a design TAT (Turn Around Time).

Japanese Laid-Open Patent Application JP-2006-209702 discloses a technique that can suppress increase in the design TAT while considering the manufacturing variability. According to the technique, unrealistic patterns of the manufacturing variability are excluded from consideration. For example, let us consider a case where a width and a thickness of an interconnection can vary from respective design values in a range from $-3\sigma$ to $+3\sigma$ ($\sigma$: standard deviation). In this case, a probability that both the width and thickness "simultaneously" vary to the maximum extent is extremely low from a statistical point of view. If such extreme situations are taken into consideration, it is necessary to support those extreme situations, which causes increase in the number of circuit design modification times. Therefore, according to the technique, such the extreme situations are excluded from the consideration (this scheme is hereinafter referred to as "statistical relaxation"). More specifically, the statistical relaxation is applied to calculation of corner conditions under which an interconnect delay becomes maximum or minimum. Then, interconnect resistance and interconnect capacitance under the corner conditions are provided as a library. This library is referred to in LPE (Layout Parameter Extraction). Consequently, it is possible to perform the timing verification in consideration of the manufacturing variability while excluding the extreme situations. In other words, it is possible to perform high-accuracy timing verification while preventing unnecessary increase in the design TAT.

Japanese Laid-Open Patent Application JP-2008-028161 also discloses a method of designing a semiconductor device in consideration of the statistical relaxation. First, correction parameters indicating variations of interconnect resistance and parasitic capacitance from design values due to the manufacturing variability are calculated. At this time, the correction parameters are calculated based on the above-described statistical relaxation scheme. Next, the LPE is performed based on a layout of the semiconductor device and thereby the interconnect resistance and parasitic capacitance related to an interconnection in the layout are extracted. After the LPE is completed, the extracted interconnect resistance and parasitic capacitance are respectively corrected by using the above-mentioned correction parameters. The post-correction interconnect resistance and parasitic capacitance are used for operation verification of the semiconductor device.

By the way, a contact structure is used in a semiconductor device for connecting between an interconnection formed in an interconnection layer and a transistor formed on a semiconductor substrate. The contact structure is so formed as to penetrate through an interlayer insulating film between the interconnection and the transistor.

Here, the inventor of the present application has recognized the following points. With increasing miniaturization of a semiconductor device in recent years, an interval between adjacent contact structures is getting narrower. Such tendency is conspicuous, far example, in a memory macro in which a large number of cell transistors are integrated. When the interval between adjacent contact structures becomes narrower, influence of the manufacturing variability of the contact structure on the parasitic capacitance is considered to become significant and nonnegligible. It is therefore desirable in designing a semiconductor device to consider the influence of the manufacturing variability of the interconnection as well as the contact structure.

SUMMARY OF THE INVENTION

In one embodiment of the present invention, a method of designing a semiconductor device is provided. The semiconductor device has an interconnect structure. The interconnect structure has: a main interconnection formed in an interconnection layer; and a contact structure electrically connected to the main interconnection and extending from the main interconnection toward a semiconductor substrate. A plurality of parameters contributing to parasitic capacitance and interconnect resistance of the interconnect structure include: a plurality of main parameters including a width and a thickness of the main interconnection; and at least one sub parameter different from the plurality of main parameters. Variation of each of the plurality of parameters from a design value caused by manufacturing variability is represented within a predetermined range. A maximum value and a minimum value of the parasitic capacitance of the interconnect structure are a maximum capacitance value and a minimum capacitance value, respectively. A maximum value and a minimum value of the interconnect resistance of the interconnect structure are a maximum resistance value and a minimum resistance value, respectively.

The method of designing the semiconductor device includes: (A) reading an interconnect structure data indicating the interconnect structure from a memory device; (B) calculating the maximum capacitance value, the minimum capacitance value, the maximum resistance value and the minimum resistance value under a condition that respective variation amplitudes of the plurality of main parameters do not simultaneously take maximum values and variation of the sub parameter is fixed to a predetermined value; (C) generating, by using the maximum capacitance value, the minimum capacitance value, the maximum resistance value and the minimum resistance value, a CR-added netlist in which the parasitic capacitance and the interconnect resistance are added to a net of the interconnect structure; and (D) performing operation verification of the semiconductor device by using the CR-added netlist.

According to the present invention, it is possible to suppress increase in the design TAT while considering the manufacturing variability of the contact structure.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 shows an example of setting of variation of each parameter in a case of sensitivity analysis with respect to a word line;

FIG. 13 shows an example of setting of variation of each parameter in a case of capacitance analysis with respect to the interconnect structure;

FIG. 17 shows an example of setting of variation of each parameter in a case of resistance analysis with respect to the interconnect structure;

FIG. 19 shows an example of CR combination in a CR-added cell netlist;

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Equipotential Interconnect Structure Including Contact Structure

Figure 1:
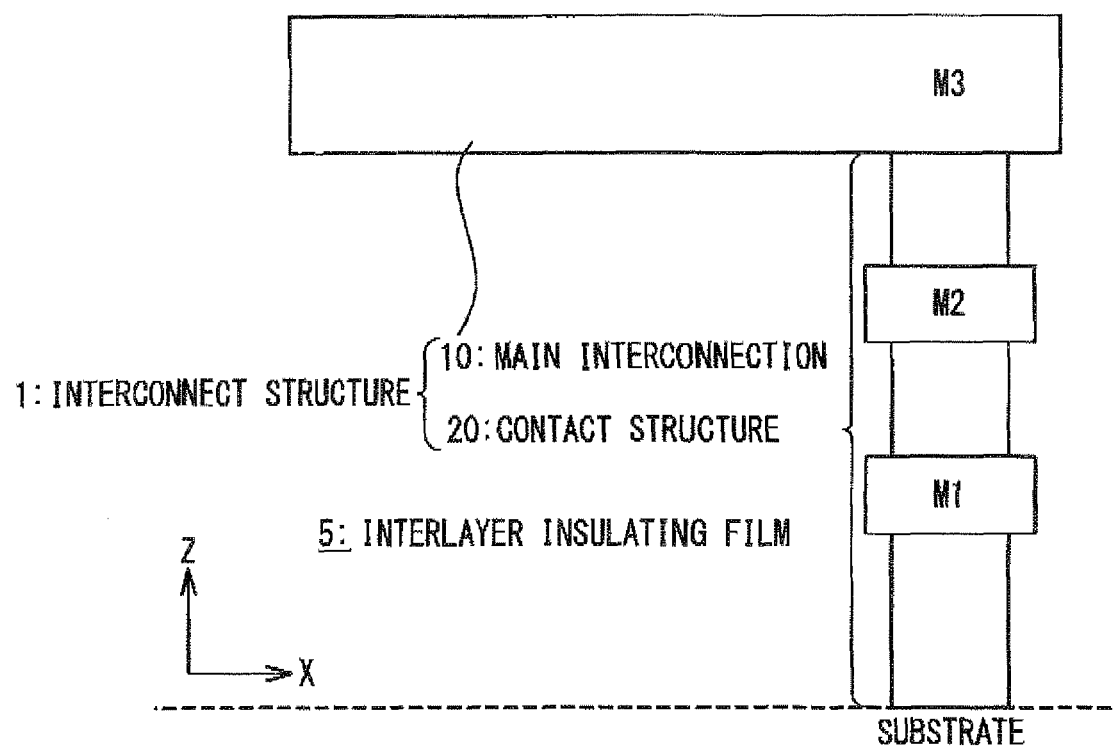
FIG. 1 is a schematic diagram showing an interconnect structure including a contact structure.

FIG. 1 schematically shows an interconnect structure 1 in a semiconductor device, which is considered in the present embodiment. In FIG. 1, a plane parallel to a surface of a semiconductor substrate is represented by a XY plane and a direction perpendicular to the XY plane is represented by a Z-direction.

As shown in FIG. 1, the interconnect structure 1 includes a main interconnection 10 and a contact structure 20 electrically connected to the main interconnection 10. The main interconnection 10 is formed in an interconnection layer located above the semiconductor substrate and is parallel to the XY plane. On the other hand, the contact structure 20 is so formed along the Z-direction as to penetrate through an interlayer insulating film 5 below the main interconnection 10. That is, the contact structure 20 is so formed as to extend from the main interconnection 10 toward the semiconductor substrate. The contact structure 20 has a "stacked structure" in which conductors (vias, cushion interconnections, contacts and the like) formed in respective layers below the main interconnection 10 are stacked. The cushion interconnection is an interconnection in the stacked structure.

The main interconnection 10 and the contact structure 20 are electrically connected with each other, and their potentials are the same. In that sense, it can be said that the interconnect structure 1 is an "equipotential structure". Regarding a netlist used in a design phase, the equipotential interconnect structure 1 is represented by one net (equipotential net).

Devices having the interconnect structure 1 as shown in FIG. 1 include semiconductor memories such as DRAM, SRAM, eDRAM (embedded DRAM) and flash memory. Such a semiconductor memory is provided with word lines and bit lines for selectively drive a cell transistor in a memory cell. A word line and a bit line respectively are connected to the cell transistor through contact structures. Therefore, the word line or the bit line corresponds to the main interconnection 10 shown in FIG. 1.

Figure 2:
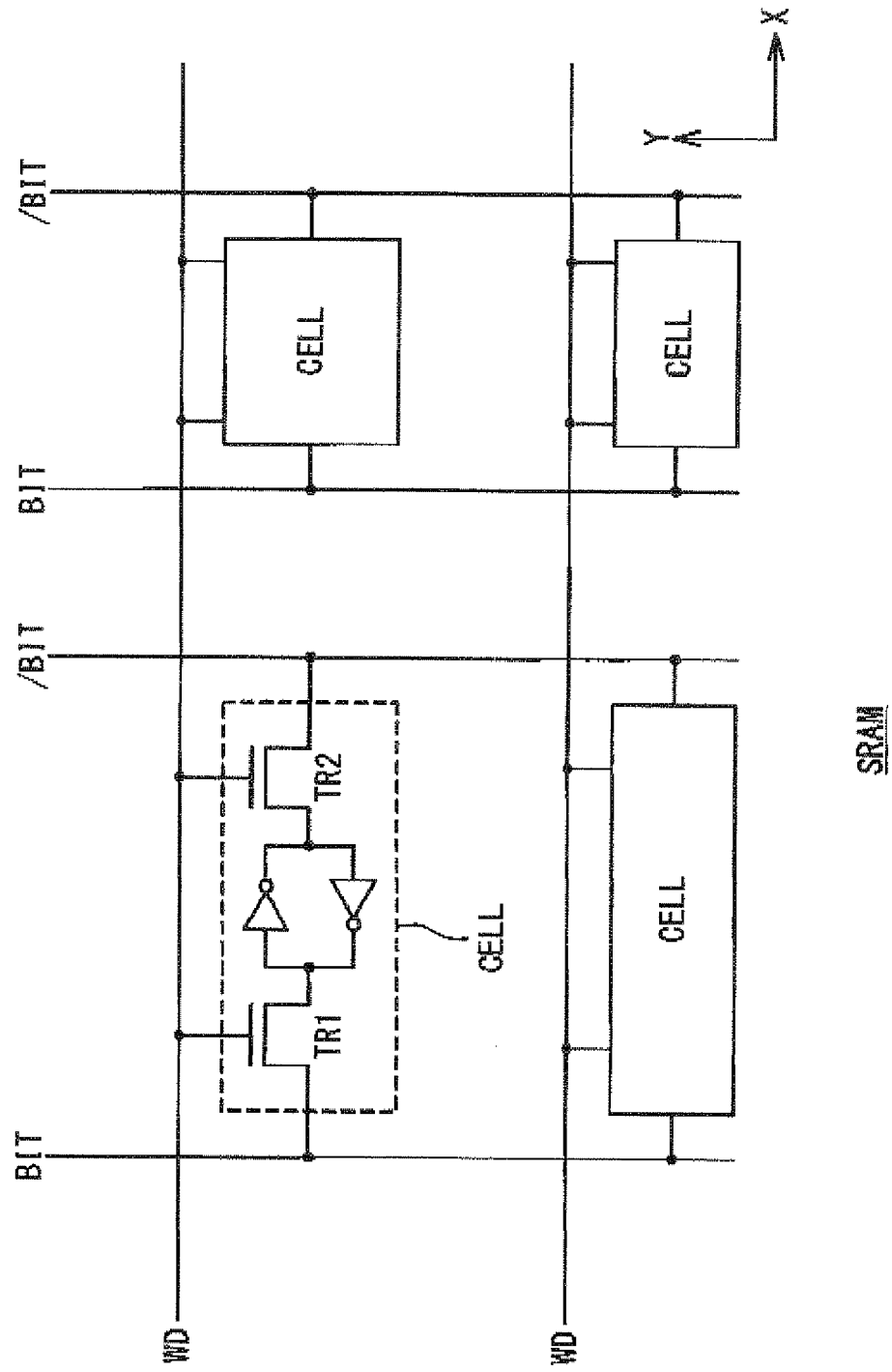
FIG. 2 is a circuit diagram showing a SRAM cell array.

FIG. 2 shows a circuit configuration of an SRAM as an example of the semiconductor memory. The SRAM has a cell array in which a plurality of memory cells CELL are arranged in an array form. Moreover, a plurality of word lines WD are formed in the X-direction, and a plurality of complementary bit line pairs BIT, /BIT are formed in the Y-direction. The memory cells CELL are placed at respective intersections of the word lines WD and the complementary bit line pairs BIT, /BIT. Each memory cell CELL has a memory unit comprising cell transistors TR1, TR2 and two inverters. Gates of the cell transistors TR1 and TR2 are connected to one word line WD.

A source or a drain of the cell transistor TR1 is connected to the bit line BIT, and a source or a drain of the cell transistor TR2 is connected to the bit line /BIT. The cell transistors TR1 and TR2 are driven by applying appropriate potentials respectively to the word line WD and the bit lines BIT and /BIT.

Figure 3:
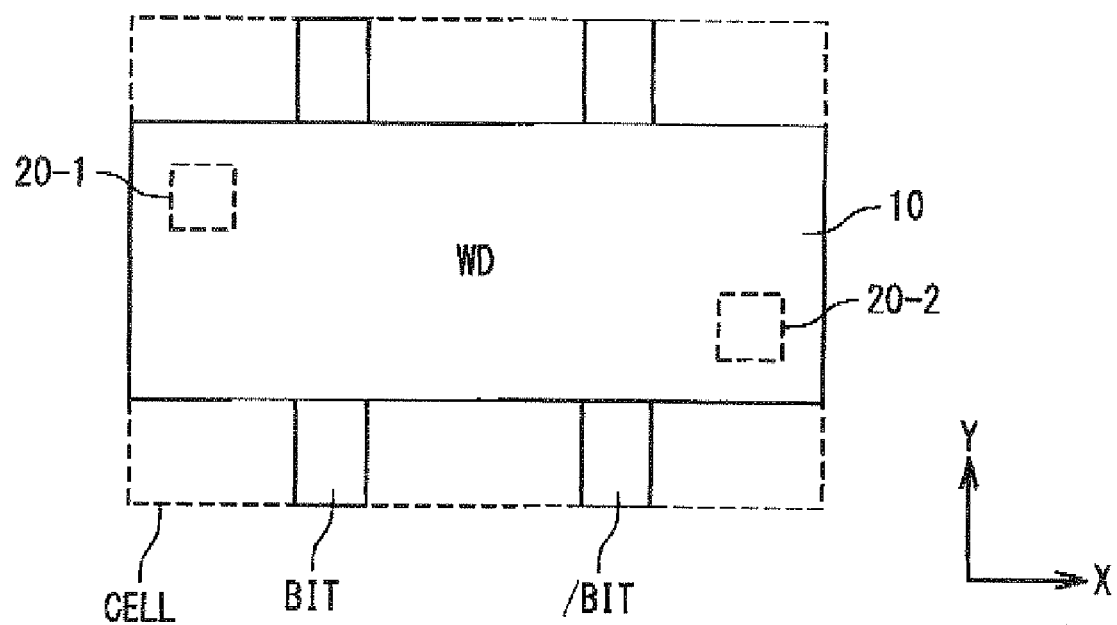
FIG. 3 is a plan view showing an example of a planar layout of one memory cell.

FIG. 3 shows an example of a planar layout of one memory cell CELL shown in FIG. 2. The word line WD is connected to the cell transistor TR1 (TR2) through the contact structure 20-1 (20-2).

Figure 4:
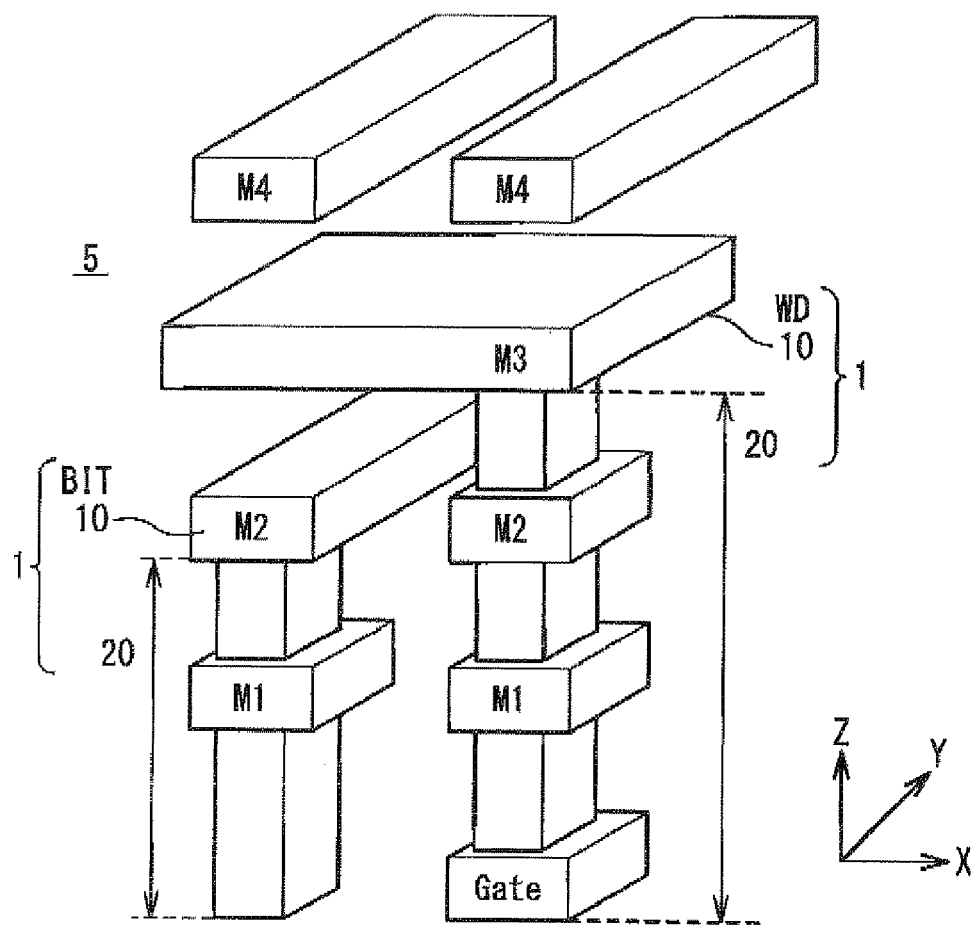
FIG. 4 is a schematic diagram showing the interconnect structure in the SRAM.

FIG. 4 shows a three-dimensional structure of one unit including one word line WD and one bit line BIT shown in FIG. 3. As shown in FIG. 4, interconnection layers M1, M2, M3 and M4 are provided in this order from below to above. Interconnections extending in the X-direction are formed in the interconnection layers M1 and M3. On the other hand, interconnections extending in the Y-direction are formed in the interconnection layers M2 and M4.

The word line WD is the main interconnection 10 formed in the interconnection layer M3, which extends in the X-direction. The word line WD is connected to the cell transistor TR through the contact structure 20. The word line WD and the contact structure 20 constitute one interconnect structure 1 (equipotential structure). Here, the contact structure (stacked structure) 20 connected to the word line WD includes the gate of the cell transistor TR, a contact formed between the gate and the interconnection layer M1, a cushion interconnection formed in the interconnection layer M1, a via formed between the interconnection layers M1 and M2, a cushion interconnection formed in the interconnection layer M2 and a via formed between the interconnection layers M2 and M3.

The bit line BIT is the main interconnection 10 formed in the interconnection layer M2, which extends in the Y-direction. The bit line BIT is connected to the cell transistor TR through the contact structure 20. The bit line BIT and the contact structure 20 constitute one interconnect structure 1 (equipotential structure). Here, the contact structure (stacked structure) 20 connected to the bit line BIT includes a contact formed between the source/drain and the interconnection layer M1, a cushion interconnection formed in the interconnection layer M1 and a via formed between the interconnection layers M1 and M2.

In the cell array of the SRAM, the unit structure shown in FIG. 4 are repeated. By using the unit structure shown in FIG. 4 as an example, extraction of parasitic capacitance and interconnect resistance of the interconnect structure 1 will be described below in detail.

2. Sensitivity Analysis

According to the present embodiment, as Will be described later, extraction of the parasitic capacitance C of the interconnect structure 1 is performed in consideration of the manufacturing variability. The parasitic capacitance C of the interconnect structure 1 depends on a plurality of parameters Pk (index k represents kind of the parameters). In other words, the plurality of parameters Pk contribute to the parasitic capacitance C of the interconnect structure 1.

The parameter Pk can be expressed as "Pk=P0k+ΔPk". Here, P0k is a design value (typical value) of the parameter Pk, and ΔPk is variation from the design value P0k caused by the manufacturing variability. The variation ΔPk is represented within a predetermined variation range "−δPk to +δPk". Here, −δPk is a lower limit of the variation ΔPk, and +δPk is an upper limit of the variation ΔPk. Typically, a distribution of the variation ΔPk is represented by a normal distribution. When the standard deviation of the distribution is σPk, the variation ΔPk can be expressed as "ΔPk=αPk× σPk". When the coefficient αPk is within a range from −3 to +3, the range of the variation ΔPk is represented by "−3σPk to +3σPk", which is sufficient from a statistical point of view.

In order to extract the parasitic capacitance 5. C of the interconnect structure 1 in consideration of the manufacturing variability, it is necessary to vary each parameter Pk within the above-mentioned variation range. However, to blindly vary all the parameter Pk is inefficient, which causes significant increase in computation load. It is therefore important to previously determine policy on how to and which parameter Pk has to be treated. To this end, according to the present embodiment, sensitivity (response) of the parasitic capacitance C to manufacturing variation of each parameter Pk is first analyzed.

For example, whether the parasitic capacitance C increases or decreases in response to variation of a certain parameter Pk from its design value is analyzed.

Also for example, to what extent variation of a certain parameter Pk contributes to variation of the parasitic capacitance C, namely, degree of contribution of the parameter Pk to the parasitic capacitance C is analyzed. A parameter Pk whose degree of contribution to the parasitic capacitance C is relatively large is hereinafter referred to as a "main parameter (critical parameter)". On the other hand, a parameter Pk whose degree of contribution to the parasitic capacitance C is relatively small is hereinafter referred to as a "sub parameter". To classify the parameters Pk into the main parameter and the sub parameter is important in terms of efficient extraction processing of the parasitic capacitance C. For example, the manufacturing variability of the main parameter is considered in depth while the manufacturing variability of the sub parameter is considered simply, which can improve the processing efficiency (computing speed).

It should be noted that since the main interconnection 10 (word line WD, bit line BIT) occupies the largest volume among components of the interconnect structure 1, at least a width and a thickness of the main interconnection 10 are treated a the "main parameter". In the sensitivity analysis, whether another parameter Pk is the main parameter or the sub parameter is determined. In particular, the interconnect structure 1 in the present embodiment includes the contact structure 20 and the parameters Pk related to the contact structure 20 are analyzed intensively.

The sensitivity analysis of the parasitic capacitance C of a word interconnect structure having the word line WD as the main interconnection 10 and the sensitivity analysis of the parasitic capacitance C of a bit interconnect structure having the bit line BIT as the main interconnection 10 will be described below.

2-1. Word Interconnect Structure

The sensitivity analysis of the parasitic capacitance C of the word Interconnect structure will be described with reference to FIG. 4 and FIG. 5. The word line WD as the main interconnection 10 is farmed in the interconnection layer M3. A width and a thickness of the word line WD are w3 and t3, respectively. A film thickness of an interlayer insulating film formed in a layer V3 (first layer) placed immediately above the interconnection layer M3 is d3. A layer placed immediately above the layer V3 is the interconnection layer M4 (supra-interconnection layer), and a width and a thickness of an interconnection formed in the interconnection layer M4 are w4 and t4, respectively. The thickness t4 is the same as a film thickness of an interlayer insulating film in the interconnection layer M4.

The contact structure 20 has the stacked structure in which conductors formed in respective layers below the interconnection layer M3 are stacked. A film thickness of an interlayer insulating film formed in a layer V2 (second layer) placed immediately below the interconnection layer M3 is d2. A layer placed immediately below the layer V2 is the interconnection layer M2 (sub-interconnection layer), and a width and a thickness of an interconnection formed in the interconnection layer M2 are w2 and t2, respectively. The thickness t2 is the same as a film thickness of an interlayer insulating film in the interconnection layer M2. A film thickness of an interlayer insulating film formed in a layer V1 placed immediately below the interconnection layer M2 is d1. A layer placed immediately below the layer V1 is the interconnection layer M1, and a width and a thickness of an interconnection formed in the interconnection layer M1 are w1 and t1, respectively. The thickness t1 is the same as a film thickness of an interlayer insulating film in the interconnection layer M1. A film thickness of an interlayer insulating film below the interconnection layer M1 is d0.

The above-mentioned w4, t4, d3, w3, t3, d2, w2, t2, d1, t1 and d0 are considered as a plurality of parameters Pk contributing to the parasitic capacitance C of the word interconnect structure. The interconnect width w3 and the interconnect thickness t3 of the word line WD among them are the main parameters. The variation ΔPk of each parameter Pk from its design value is represented within a variation range "−3σPk to +3σPk".

In the present embodiment, TCAD (Technology CAD) is used to perform. "three-dimensional electromagnetic analysis" of the unit structure shown in FIG. 4 in order to calculate the parasitic capacitance C of the word interconnect structure. By the three-dimensional electromagnetic analysis with the use of the TOAD, the parasitic capacitance C can be calculated with high accuracy. In the analysis, the variation ΔPk of each parameter Pk contributing to the parasitic capacitance C is set to various conditions within the above-mentioned variation range.

FIG. 5 shows seven kinds of examples as the set conditions of the variation ΔPk of each parameter Pk. In each condition, "+3σ" means that the variation ΔPk of the corresponding parameter Pk is set to the upper limit (+3σPk), and "−3σ" means that the variation ΔPk of the corresponding parameter Pk is set to the lower limit (−3σPk). Nothing described means that the variation ΔPk is 0, namely the corresponding parameter Pk is set to its design value P0k.

Condition-1: All parameters Pk are set to the respective design values P0k (center condition). The parasitic capacitance C calculated at this time is Ctyp.

Condition-2: The variation of the film thickness d3 immediately above the interconnection layer M3 and the film thickness d2 immediately below the interconnection layer M3 each is set to the upper limit (+3σ).

Condition-3: The variation of the film thickness d3 immediately above the interconnection layer M3 and the film thickness d2 immediately below the interconnection layer M3 each is set to the lower limit (−3σ).

Condition-4: The variation of the film thickness d3 immediately above the interconnection layer M3 and the film thicknesses (d2, t2, d1, t1 and d0) of respective layers of the contact structure 20 each is set to the upper limit (+3σ). That is, the variation of t2, d1, t1 and d0 each is set to the upper limit, in addition to the above-mentioned Condition-2.

Condition-5: The variation of the film thickness d3 immediately above the interconnection layer M3 and the film thicknesses (d2, t2, d1, t1 and d0) of respective layers of the contact structure 20 each is set to the lower limit (−3σ). That is, the variation of t2, d1, t1 and d0 each is set to the lower limit, in addition to the above-mentioned Condition-3.

Condition-6; The variation of the film thickness d3 immediately above the interconnection layer M3 and the film thickness d2 immediately below the interconnection layer M3 each is set to the lower limit (−3σ), as in the case of the above Condition-3. In addition to that, the variation of the interconnect width w4 in the supra-interconnection layer M4 and the interconnect width w2 in the sub-interconnection layer M2 each is set to the upper limit (+3σ).

Condition-7: The variation of the film thickness d3 immediately above the interconnection layer M3 and the film thickness d2 immediately below the interconnection layer M3 each is set to the lower limit (−3σ), as in the case of the above Condition-3. In addition to that, the variation of the interconnect thickness t4 in the supra-interconnection layer M4 and the interconnect thickness t2 in the sub-interconnection layer M2 each is set to the upper limit (+3σ).

Figure 6:
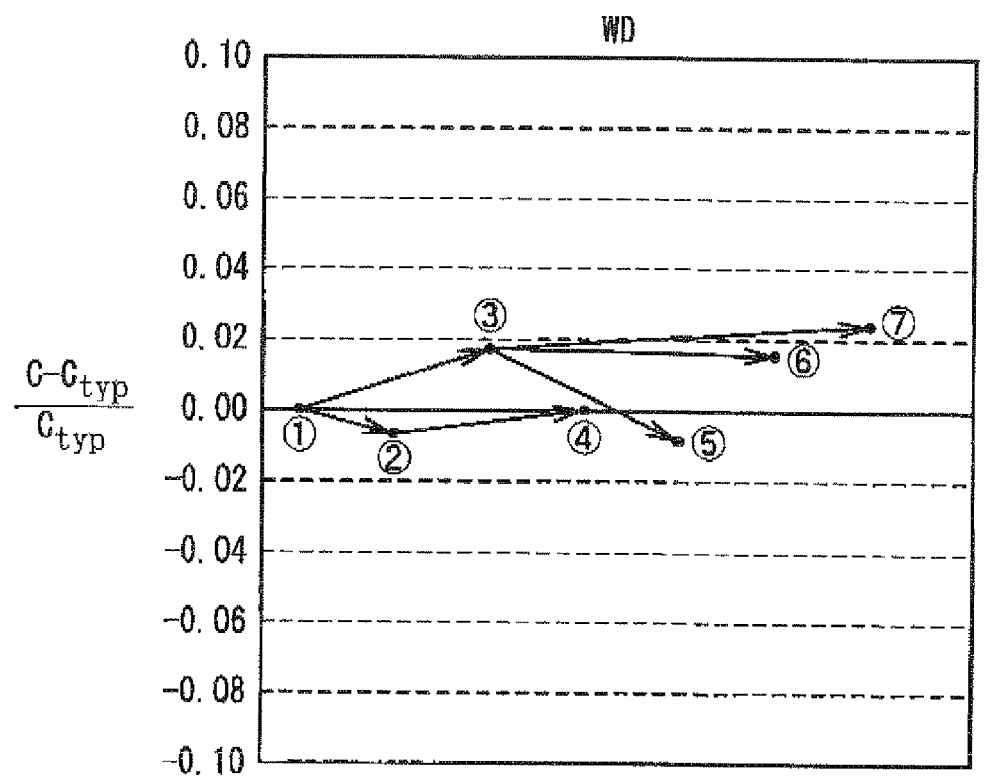
FIG. 6 is a graph showing a result of the sensitivity analysis with respect to the word line.

FIG. 6 shows calculation results of the parasitic capacitance C with respect to the above-mentioned conditions. The vertical axis represents a variation ratio (C−Ctyp)/Ctyp of the parasitic capacitance C. The followings can be seen from the results shown in FIG. 6.

It turns out from a comparison between Condition-1 and Condition-2 that the parasitic capacitance C decreases when the film thickness d3 immediately above the interconnection layer M3 and the film thickness d2 immediately below the interconnection layer M3 are increased. Also it turns out from a comparison between Condition-1 and Condition-3 that the parasitic capacitance C increases when the film thickness d3 immediately above the interconnection layer M3 and the film thickness d2 immediately below the interconnection layer M3 are decreased. That is to say, it turns out that the parasitic capacitance C is in inverse proportion to the film thickness d2, d3.

It turns out from a comparison between Condition-2 and Condition-4 that the parasitic capacitance C increases when the film thicknesses t2, d1, t1 and d0 in the contact structure 20 are increased. Also, it turns out from a comparison between Condition-3 and Condition-5 that the parasitic capacitance C decreases when the film thicknesses t2, d1, t1 and d0 in the contact structure 20 are decreased. That is to say, it turns out that the parasitic capacitance C is proportional to the film thicknesses t2, d1, t1 and d0. Note that this trend is opposite to the above-mentioned trend regarding the film thickness d2, d3. This trend is attributed to a fact that lateral capacitance of the contact structure 20 is increased when the film thicknesses t2, d1, t1 and d0 are increased.

In the cases of Condition-4 and Condition-5, the variation of the parasitic capacitance C from Ctyp is small and the absolute value of the variation ratio is at most 1%. This is because, even when the film thickness of each layer is increased (decreased) as a whole, decrease (increase) in the parasitic capacitance C due to the increase (decrease) in d3 and d2 and increase (decrease) in the parasitic capacitance C due to the increase (decrease) in t2, d1, t1 and d0 cancel each other.

It turns out from a comparison between Condition-3 and Condition-6 that the variation of the interconnect width w4 in the supra-interconnection layer M4 and the interconnect width w2 in the sub-interconnection layer M2 has little effect on the parasitic capacitance C. Based on this result, it is possible to determine that the manufacturing variability of the interconnect widths w4 and w2 need not be considered on extracting the parasitic capacitance C.

It turns out from a comparison between Condition-3 and Condition-7 that the parasitic capacitance C increases when the interconnect thickness t4 in the supra-interconnection layer M4 and the interconnect thickness t2 in the sub-interconnection layer M2 are increased. Note that this trend also is opposite to the above-Mentioned trend regarding the film thickness d2, d3. The increase in the parasitic capacitance C in this case is mainly attributed to increase in lateral capacitance of the contact structure 20 due to the increase in the interconnect thickness t2 in the sub-interconnection layer M2. On the other hand, influence of the increase in the interconnect thickness t4 in the supra-interconnection layer M4 is considered to be small.

Moreover, it turns out that the variation of the parasitic capacitance C from Ctyp is not so much it either condition. Let us consider a case where a threshold value of nonnegligible variation in the parasitic capacitance C is "absolute value of the variation ratio=3%", for example. In this case, it turns out that the absolute value of the variation ratio is less than the threshold value in either condition. Based on this result, it is possible to determine that the parameters other than the interconnect width w3 and the interconnect thickness t3 of the word line WD can be treated as the "sub parameters".

2-2. Bit Interconnect Structure

Figure 7:
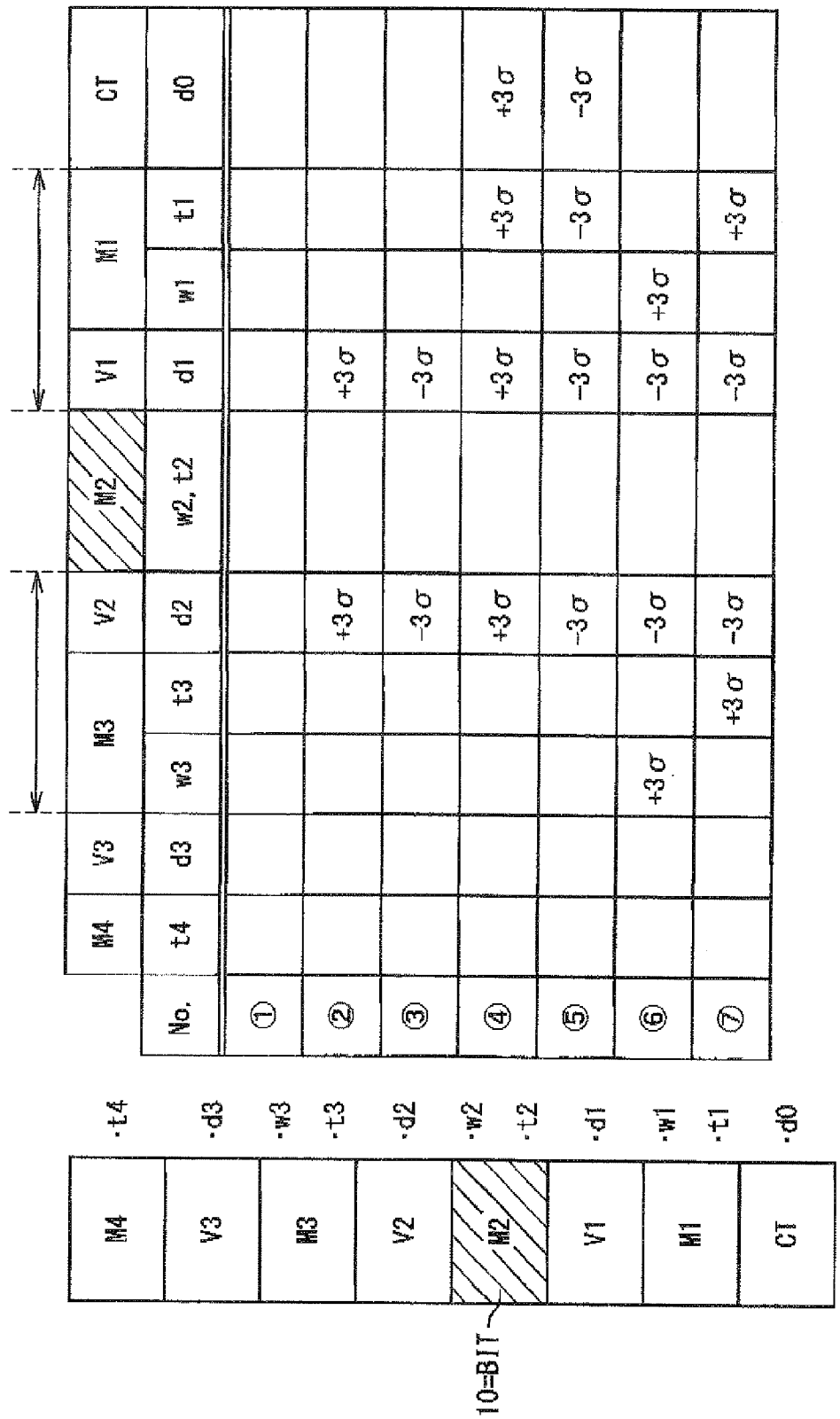
FIG. 7 shows an example of setting of variation of each parameter in a case of sensitivity analysis with respect to a bit line.

The sensitivity analysis of the parasitic capacitance C of the bit interconnect structure will be described with reference to FIG. 4 and FIG. 7. The bit line BIT as the main interconnection 10 is formed in the interconnection layer M2. A width and a thickness of the bit line BIT are w2 and t2, respectively, A film thickness of an interlayer insulating film formed in a layer V2 (first layer) placed immediately above the interconnection layer M2 is d2. A layer placed immediately above the layer V2 is the interconnection layer M3 (supra-interconnection layer), and a width and a thickness of an interconnection formed in the interconnection layer M3 are w3 and t3, respectively. The thickness t3 is the same as a film thickness of an interlayer insulating film in the interconnection layer M3. Film thicknesses of interlayer insulating films in the layer V3 above the interconnection layer M3 and the interconnection layer M4 are d3 and t4, respectively.

The contact structure 20 has the stacked structure in which conductors formed in respective layers below the interconnection layer M2 are stacked. A film thickness of an interlayer insulating film formed in a layer V1 (second layer) placed immediately below the interconnection layer M2 is d1. A layer placed immediately below the layer V1 is the interconnection layer M (sub-interconnection layer), and a width and a thickness of an interconnection formed in the interconnection layer M1 are w1 and t1, respectively. The thickness t1 is the same as a film thickness of an interlayer insulating film in the interconnection layer M1. A film thickness of an interlayer insulating film below the interconnection layer M1 is d0.

The above-mentioned t4, d3, w3, t3, d2, w2 t2, d1, w1, t1 and d0 are considered as a plurality of parameters Pk contributing to the parasitic capacitance C of the bit interconnect structure. The interconnect width w2 and the interconnect thickness t2 of the bit line BIT among them are the main parameters. The variation $\Delta Pk$ of each parameter Pk from its design value is represented within a variation range "$-3\sigma Pk$ to $+3\sigma Pk$".

As in the case of the word interconnect structure, the TCAD is used to perform "three-dimensional electromagnetic analysis" of the unit structure shown in FIG. 4. Thus, the parasitic capacitance C of the bit interconnect structure can be calculated with high accuracy. In the analysis, the variation $\Delta Pk$ of each parameter Pk contributing to the parasitic capacitance C is set to various conditions within the above-mentioned variation range. FIG. 7 shows seven kinds of examples as the set conditions of the variation $\Delta Pk$ of each parameter Pk.

Condition-1; All parameters Pk are set to the respective design values P0k (center condition). The parasitic capacitance C calculated at this time is Ctyp.

Condition-2: The variation of the film thickness d2 immediately above the interconnection layer M2 and the film thickness d1 immediately below the interconnection layer M2 each is set to the upper limit ($+3\sigma$).

Condition-3: The variation of the film thickness d2 immediately above the interconnection layer M2 and the film thickness d1 immediately below the interconnection layer M2 each is set to the lower limit ($-3\sigma$).

Condition-4: The variation of the film thickness d2 immediately above the interconnection layer M2 and the film thicknesses (d1, t1 and d0) of respective layers of the contact structure 20 each is set to the upper limit ($+3\sigma$). That is, the variation of t1 and d0 each is set to the upper limit, in addition to the above-mentioned Condition-2.

Condition-5; The variation of the film thickness d2 immediately above the interconnection layer M2 and the film thicknesses (d1, t1 and d0) of respective layers of the contact structure 20 each is set to the lower limit ($-3\sigma$). That is, the variation of t1 and d0 each is set to the lower limit, in addition to the above-mentioned Condition-3.

Condition-6: The variation of the film thickness d2 immediately above the interconnection layer M2 and the film thickness d1 immediately below the interconnection layer M2 each is set to the lower limit ($-3\sigma$) as in the case of the above Condition-3. In addition to that, the variation of the interconnect width w3 in the supra-interconnection layer M3 and the interconnect width w1 in the sub-interconnection layer M1 each is set to the upper limit ($+3\sigma$).

Condition-7: The variation of the film thickness d2 immediately above the interconnection layer M2 and the film thickness d1 immediately below the interconnection layer M2 each is set to the lower limit ($-3\sigma$), as in the case of the above Condition-3. In addition to that, the variation of the interconnect thickness t3 in the supra-interconnection layer M3 and the interconnect thickness t1 in the sub interconnection layer M1 each is set to the upper limit ($+3\sigma$).

Figure 8:
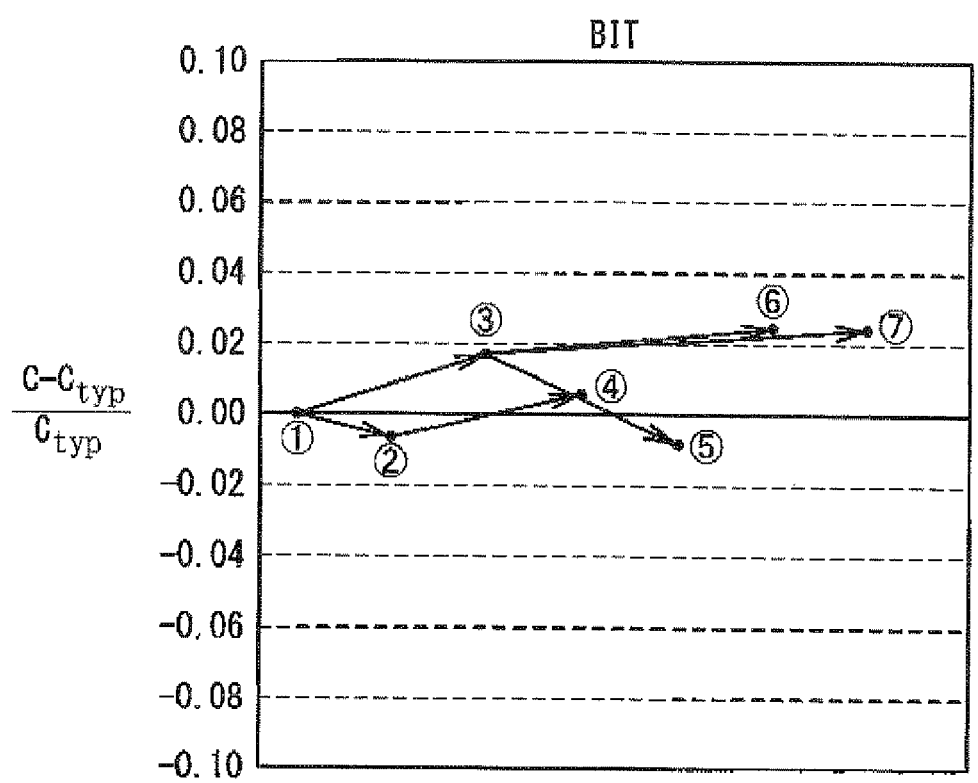
FIG. 8 is a graph showing a result of the sensitivity analysis with respect to the bit line.

FIG. 8 shows calculation results of the parasitic capacitance C with respect to the above-mentioned conditions. The same trends as in the case of FIG. 6 can be seen from FIG. 8.

2-3. Sensitivity Analysis System

Figure 9:
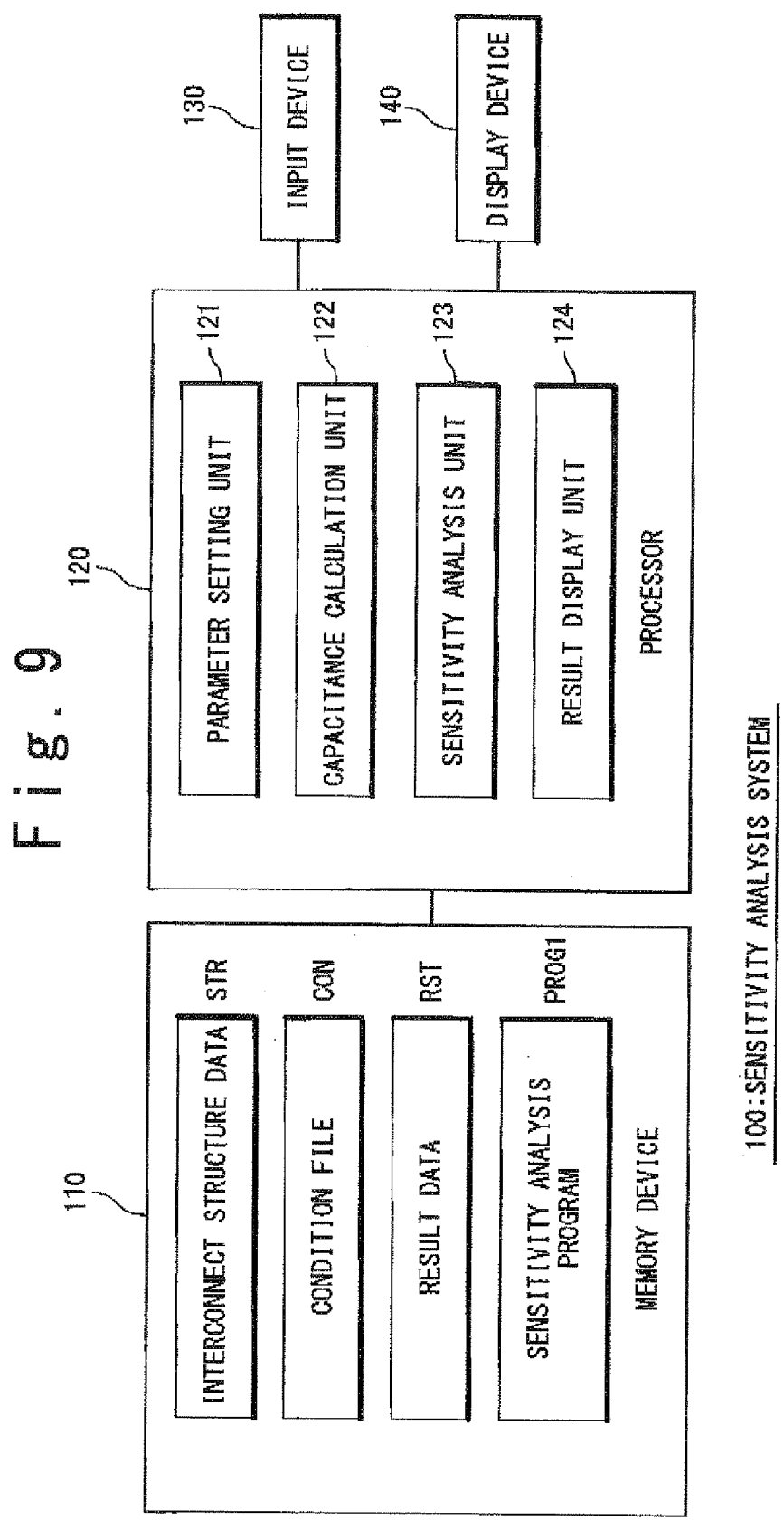
FIG. 9 is a block diagram showing a configuration of a sensitivity analysis system according to an embodiment of the present invention.

The sensitivity analysis processing according to the present embodiment can be achieved by a computer system. FIG. 9 is a block diagram showing a configuration of a sensitivity analysis system 100 executing the sensitivity analysis processing according to the present embodiment. The sensitivity analysis system 100 has a memory device 110, a processor 120, an input device 130 and a display device 140.

An interconnect structure data STR and a condition file CON are stored in the memory device 110. The interconnect structure data STR indicates the interconnect structure (layout, process cross-section) shown in FIG. 4. The condition file CON indicates the various set conditions of the variation $\Delta Pk$ of each parameter Pk shown in FIG. 5 and FIG. 7. A sensitivity analysis program PROG1 is a computer program executed by the processor 120. The sensitivity analysis program PROG1 is stored in the memory device 110. The sensitivity analysis program PROG1 may be stored in a computer-readable recording medium.

The processor 120 executes the sensitivity analysis program PROG1 to perform the sensitivity analysis according to the present embodiment. More specifically, a parameter setting unit 121, a capacitance calculation unit 122, a sensitivity analysis unit 123 and a result display unit 124 are achieved by cooperation of the processor 120 and the sensitivity analysis program PROG1. These function blocks perform the following processing.

Figure 10:
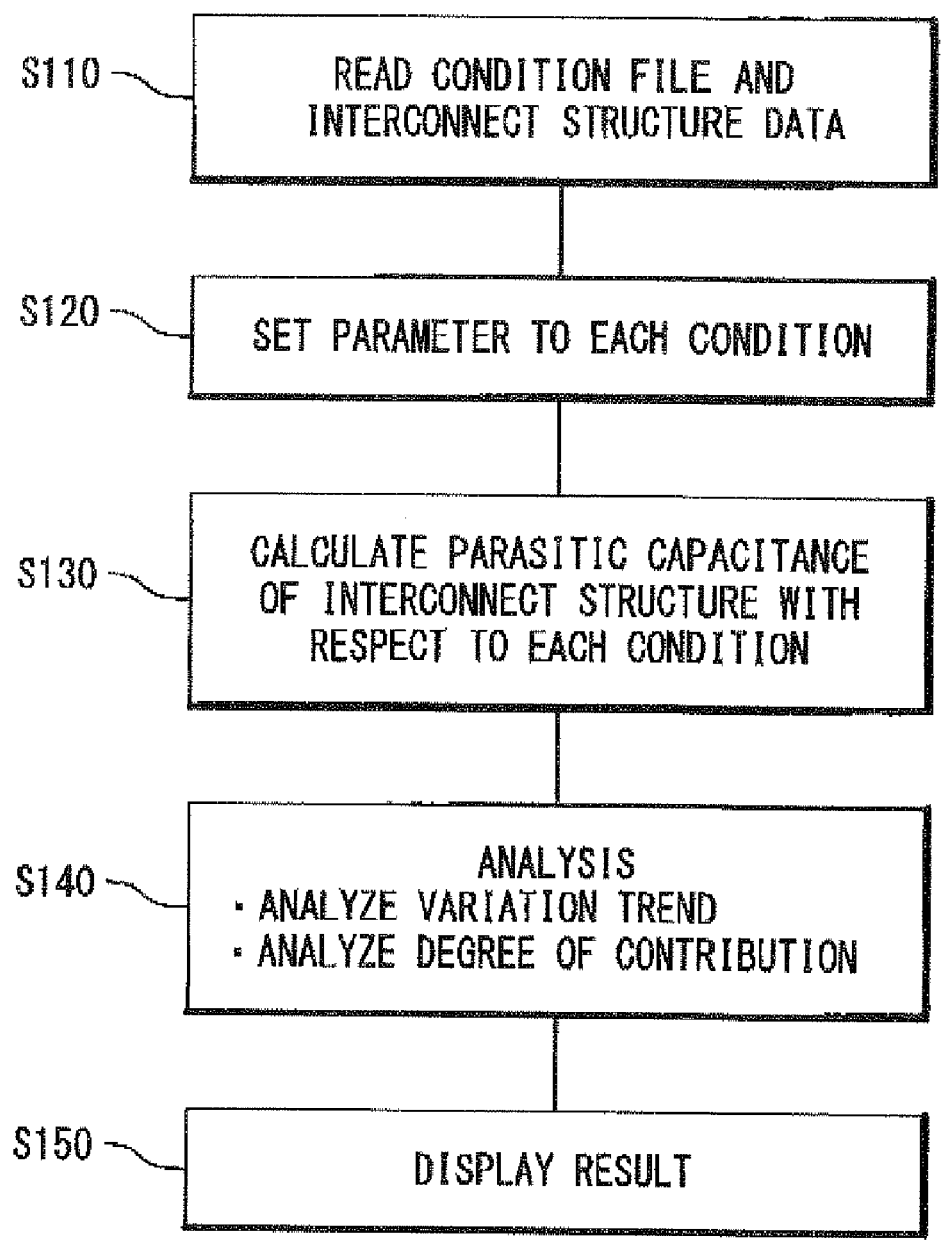
FIG. 10 is a flow chart showing a method of the sensitivity analysis according to the embodiment of the present invention.

FIG. 10 is a flow chart showing the sensitivity analysis processing according to the present embodiment.

Step S110:

First, the parameter setting unit 121 reads the interconnect structure data STR and the condition file CON from the memory device 110.

Step S120:

Next, the parameter setting unit 121 sets the variation ΔPk of each parameter Pk of the interconnect structure 1 to the respective conditions (refer to FIG. 5 and FIG. 7) described in the condition file CON.

Step S130:

The capacitance calculation unit 122 includes the TOAD. The capacitance calculation unit 122 performs the three-dimensional electromagnetic analysis of the interconnect structure 1 by using the parameter Pk set in Step S120 and thereby calculates the parasitic capacitance C of the interconnect structure 1. The calculation of the parasitic capacitance C is performed with respect to each of the above-mentioned plurality of conditions. Consequently, the parasitic capacitances C of the interconnect structure 1 in the respective conditions are calculated as shown in FIG. 6 or FIG. 8. The capacitance calculation unit 122 stores a result data RST indicating the calculated parasitic capacitances C in the memory device 110.

Step S140:

The sensitivity analysis unit 123 reads the result data RST from the memory device 110. Then, the sensitivity analysis unit 123 analyzes response of the parasitic capacitance C to the variation of the parameter Pk, based on the parasitic capacitances C calculated with respect to the plurality of conditions. For example, the sensitivity analysis unit 123 can analyze whether the parasitic capacitance C increases or decreases in response to the variation of each parameter Pk, as mentioned above. That is, the sensitivity analysis unit 123 can analyze variation trend of the parasitic capacitance C in response to the variation of the parameter Pk. Moreover, the sensitivity analysis unit 123 calculates the variation of the parasitic capacitance C from Ctyp in each of the plurality of conditions. Then, the sensitivity analysis unit 123 makes a comparison between the variation of the parasitic capacitance C and a predetermined threshold value (e.g. (C-Ctyp)/Ctyp=3%) to analyze the degree of contribution of each parameter Pk to the parasitic capacitance C. It is thus possible to classify the parameter Pk into the main parameter or the sub parameter.

Step S150:

The result display unit 124 reads the result data RST from the memory device 110 and has the display device 140 display the result of the analysis. For example, the graph as shown in FIG. 6 and FIG. 8 is displayed by the display device 140. The above-described results of the sensitivity analysis are utilized in CR extraction processing described below. As will be explained later, to utilize the results of the sensitivity analysis makes it possible to efficiently perform the CR extraction processing without deteriorating precision.

3. CR Extraction in Consideration of Manufacturing Variability

Next, extraction of the parasitic capacitance C and interconnect resistance R of the interconnect structure 1 will be described below. According to the present embodiment, the manufacturing variability is taken into consideration in the extraction processing. Meanwhile, unrealistic situation is excluded from the consideration. That is to say, the "statistical relaxation" of the manufacturing variability is applied.

3-1. Statistical Relaxation

First, concept of the statistical relaxation will be explained. As an example, let us consider the manufacturing variability of parasitic capacitance of a certain interconnection. Parameters contributing to the parasitic capacitance include an interconnect width w and an interconnect thickness t of the interconnection, for example. A design value of the interconnect width w is w0, and variation from the design value w0 caused by the manufacturing variability is Δw. A design value of the interconnect thickness t is t0, and variation from the design value t0 caused by the manufacturing variability is Δt $$w = w0 + \Delta w$$

$$t = t0 + \Delta t$$

Typically, a distribution of the variation Δw, Δt each is given by a normal distribution. When, respective standard deviations are σw and σt, the variations Δw and Δt can be expressed as follows.

$$\Delta w = \alpha w \times \sigma w$$

$$\Delta t = \alpha t \times \sigma t$$

When the coefficient αw, αt each is within a range from −3 to +3, respective ranges of the variations Δw and Δt can be represented as follows.

$$\Delta w = -3\sigma w \text{ to } +3\sigma w$$

$$\Delta t = -3\sigma t \text{ to } +3\sigma t$$

When the interconnect width w and the interconnect thickness t vary, the parasitic capacitance of the interconnection also varies accordingly. In order to search the maximum value and the minimum value of the parasitic capacitance, the variations Δw and Δt may be separately varied within the above-mentioned respective ranges. However, since Δw and Δt are independent variables that vary independently of each other, probability that respective variation amplitudes of Δw and Δt simultaneously take the maximum values is extremely low. For example, a case where Δw=−3σw and Δt=+3 at is unrealistic. Therefore, such extreme cases can be excluded from consideration. That is, it is preferable that the maximum value and the minimum value of the parasitic capacitance are calculated under a condition that the respective variation amplitudes of Δw and Δt do not simultaneously take the maximum values. This is the statistical relaxation.

Figure 11:
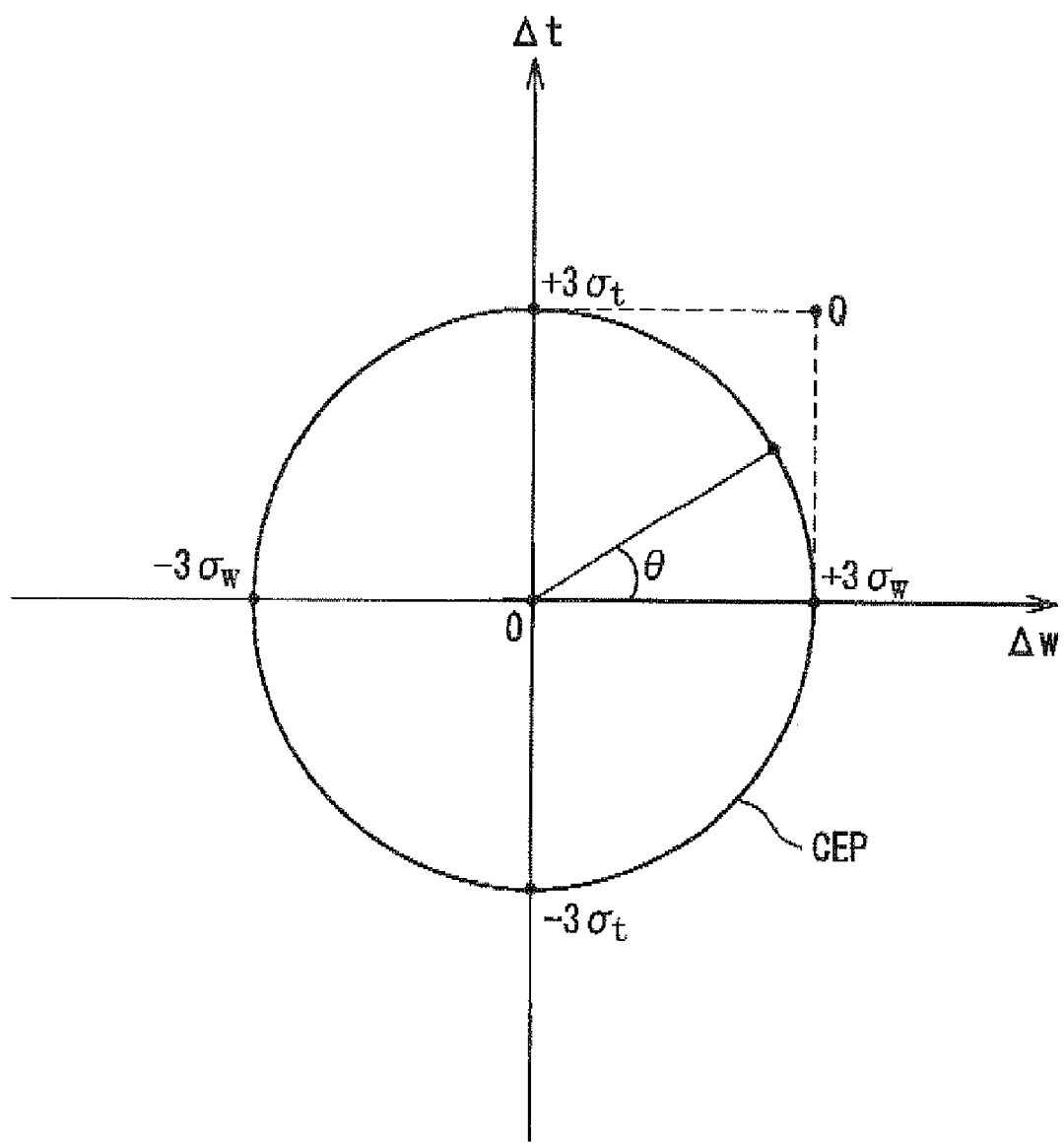
FIG. 11 is a conceptual diagram for explaining the statistical relaxation.

An example of the statistical relaxation will be described with reference to FIG. 11. In FIG. 11, two axes orthogonal to each other represent Δw and Δt, respectively. The origin O represents the center condition (Δw=0, Δt=0), and a point (Δw, Δt) represents the manufacturing variation. A probability distribution of Δw, Δt each is given by a normal distribution. The range of Δw is from −3σw to +3σw, and the range of Δt is from −3σt to +3σt.

In the plane shown in FIG. 11, a "JPDF (Joint Probability Density Function)" that gives occurrence probability of the point (Δw, Δt) can be defined. The JPDF may be called JDF (Joint Distribution Function). A curve CEP shown in FIG. 11 represents a set of points (Δw, Δt) that occur with a same probability, which is hereinafter referred to as a "circle of equal probability".

Since Δw and Δt are independent variables that vary independently of each other, probability that the respective variation amplitudes of Δw and Δt "simultaneously" take the maximum values is extremely low. For example, a point Q (Δw=+3σw, Δt=+3σt) shown in FIG. 11 is unrealistic. Therefore, such extreme cases are excluded from consideration, and only events that occur with not less than a predetermined probability are taken into consideration. It is preferable to use the above-mentioned circle of equal probability CEP as the predetermined probability. That is to say, only points within the circle of equal probability CEP are taken into consideration. Consequently, extreme cases such as the point Q are excluded and the statistical relaxation is achieved. On searching the maximum value and the minimum value of the parasitic capacitance, $\Delta w$ and $\Delta t$ are set to points on the circle of equal probability CEP of the JPDF. In other words, the maximum value and the minimum value of the parasitic capacitance under a condition represented by the following Equation (1) are calculated.

[Equation. 1]

$$\sqrt{\alpha w^2 + \alpha t^2} = 3 \quad (1)$$

3-2. Parameter Setting Policy Regarding Interconnect Structure 1

In order to extract the parasitic capacitance C of the interconnect structure 1 in consideration of the manufacturing variability, it is necessary to vary each parameter Pk. However, to blindly vary all the parameter Pk is inefficient, which causes significant increase in computation load. Therefore, according to the present embodiment, policy of setting the variation $\Delta Pk$ of each parameter Pk is determined based on the results of the sensitivity analysis described in the above Section 2. The setting policy of the variation $\Delta Pk$ of each parameter Pk in the present embodiment will be described with reference to FIG. 12.

Figure 12:
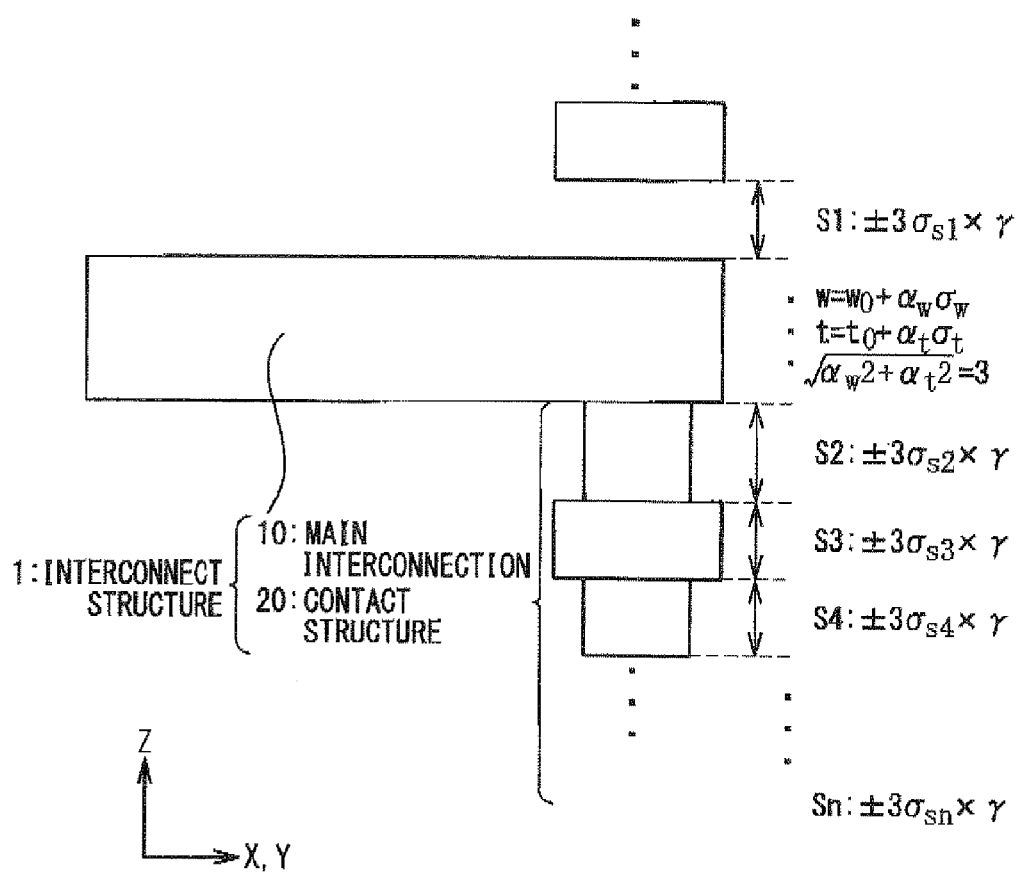
FIG. 12 is a conceptual diagram showing an interconnect structure and parameters contributing to the parasitic capacitance of the interconnect structure.

As shown in FIG. 12, the interconnect structure 1 includes the main interconnection 10 and the contact structure 20. The interconnect width and the interconnect thickness of the main interconnection 10 are represented by the above-mentioned w and t, respectively. A layer placed immediately above an interconnection layer in which the main interconnection 10 is formed is the first layer. A layer placed immediately below the interconnection layer in which the main interconnection 10 is formed is the second layer. Third to n-th (n is an integer equal to or more than 3) layers are placed in this order below the second layer. The contact structure 20 has a stacked structure in which conductors respectively formed in the second to the n-th layers are stacked. A film thickness of an interlayer insulating film formed in the i-th layer (i=1 to n) is represented by "si". A layer placed immediately above the first layer is the supra-interconnection layer. A layer placed immediately below the second layer is the sub-interconnection layer (third layer).

Parameters whose manufacturing variability is considered are as follows. As a result of the above-described sensitivity analysis, it turned out that the variation of the interconnect widths of the supra-interconnection layer and the sub-interconnection layer has little effect on the parasitic capacitance C. Therefore, the manufacturing variability of the interconnect widths of the supra-interconnection layer and the sub-interconnection layer is not considered. Also, it turned out that the variation of the interconnect thickness of the supra-interconnection layer has little effect on the parasitic capacitance C. Therefore, the manufacturing variability of the interconnect thickness of the supra-interconnection layer is not considered. Therefore, according to the present embodiment, the manufacturing variability of the interconnect width w and the interconnect thickness t of the main interconnection 10, the film thickness s1 of the first layer and the film thickness s2 to sn of the respective layers of the contact structure 20 is taken into consideration.

The variation of the film thickness si (i=1 to n) from its design value is $\Delta si$. The variation $\Delta si$ is represented within a predetermined variation range "$-\delta si$ to $+\delta si$". Here, $-\delta si$ is the lower limit of the variation $\Delta si$ and $+\delta si$ is the upper limit of the variation $\Delta si$. Typically, a distribution of the variation $\Delta si$ is given by a normal distribution. When the standard deviation of the distribution is $\sigma si$, the variation $\Delta si$ can be represented by "$\Delta si = \alpha si \times \sigma si$". When the coefficient $\alpha si$ is within a range from $-3$ to $+3$, the range of the variation $\Delta si$ is represented by "$-3\sigma si$ to $+3\sigma si$", which is sufficient from a statistical point of view.

Parameters to which the statistical relaxation as shown in FIG. 11 is applied are as follows. As an example, let us consider a case where the statistical relaxation as shown in FIG. 11 is applied to all the parameters (w, t, si). In this case, the number of dimensions of the circle of equal probability CEP needs to be increased. However, as the number of dimensions of the circle of equal probability CEP is increased, the searching for the maximum value and the minimum value of the parasitic capacitance C becomes more complex, which causes increase in computation load. Therefore, according to the present embodiment, the number of dimensions of the circle of equal probability CEP is set as small as possible without deteriorating precision. For that purpose, the statistical relaxation is applied to the "main parameters" described in the above Section 2. On the other hand, the statistical relaxation as shown in FIG. 11 is not applied to the "sub parameters". In the present embodiment, the main parameters include the interconnect width w and the interconnect thickness t of the main interconnection 10. Therefore, the statistical relaxation as shown in FIG. 11 is applied to the variation $\Delta w$ of the interconnect width w and the variation $\Delta t$ of the interconnect thickness t. That is, the maximum value and the minimum value of the interconnect capacitance C are searched for under a condition that respective variation amplitudes of the variations $\Delta w$ and $\Delta t$ do not simultaneously take maximum values (refer to the Equation (1)).

Meanwhile, the film thickness "si" of each layer is the sub parameter. Therefore, the statistical relaxation as shown in FIG. 11 is not applied to the film thickness si. Instead, the variation $\Delta si$ of each film thickness si is fixed to a predetermined value. That is the maximum value and the minimum value of the interconnect capacitance C are searched for under a condition that the variation $\Delta si$ is fixed to a predetermined value.

The setting value of the variation psi is represented by "$+3\sigma si \times \gamma$" or "$-3\sigma si \times \gamma$". Here, $\gamma$ is a relaxation coefficient, which is set to more than than 0 and not more than 1. In a case of $\gamma=1$, it means the maximum amplitude within the predetermined variation range "$-3\sigma si$ to $+3\sigma si$". However, since the respective variations $\Delta si$ also are independent variables that vary independently of each other, probability that amplitudes of all the variations $\Delta si$ simultaneously take maximum values is extremely low. Therefore, the relaxation coefficient $\gamma$ is preferably set to less than 1. In this case, the manufacturing variability is modestly relaxed. This means application of "simple statistical relaxation" instead of the statistical relaxation as shown in FIG. 11. An example of the relaxation coefficient $\gamma$ less than 1 can be obtained by the following equation (2) (refer to Japanese Laid-Open Patent Application JP-2006-209702),

[Equation 2]

$$\gamma = \frac{\sqrt{\sum_{i=1}^{n} \delta si^2}}{\sum_{i=1}^{n} \delta si} \quad (2)$$

It should be noted that the film thicknesses si of vias and contacts are determined by corresponding interlayer insulating films. The thicknesses of the interlayer insulating films are independent of each other. An interlayer insulating film corresponding to a via or a contact may be formed of a plurality of films. Even in that case, the statistical relaxation can be applied to respective film thicknesses of the plurality of films.

3-3. Extraction of Parasitic Capacitance C

Extraction of a maximum value Cmax and a minimum value Cmin of the parasitic capacitance C of the interconnect structure 1 is performed in consideration of the manufacturing variability. FIG. 13 shows set conditions of the variation of each parameter from the design value at the extraction processing.

(Center Condition)

In the center condition, the variations of the all parameters are set to 0.

(Cmax Condition)

A condition under which the maximum capacitance value Cmax is extracted is as follows. As to the main parameters, namely, the interconnect width w and the interconnect thickness t of the main interconnection 10, the condition that respective variation amplitudes of the variations Δw and Δt do not simultaneously take maximum values is imposed. Specifically, the condition represented by the above-mentioned Equation (1) is imposed. The variation Δs1 of the film thickness s1 immediately above the main interconnection 10 is set to a negative fixed value "−3σs1×γ", and the variation Δs2 of the film thickness s2 immediately below the main interconnection 10 is set to a negative fixed value "−3σs2×γ". This is because it has turned out from the result of the above-described sensitivity analysis that the parasitic capacitance C is in inverse proportion to the film thickness s1, s2. Meanwhile, the variation Δsi of the film thickness si (i=3 to n) in each of the other layers belonging to the contact structure 20 is set to a positive fixed value "+3σsi×γ". This is because it has turned out from the result of the above-described sensitivity analysis that the parasitic capacitance C is proportional to the film thickness si. A variation Δε of electric permittivity ε of the interlayer insulating film 5 is set to a positive fixed value "+3σε". Variations of the other parameters are set to 0.

(Cmin Condition)

A condition under which the minimum capacitance value Cmin is extracted is as follows. As to the main parameters, namely, the interconnect width w and the interconnect thickness t of the main interconnection 10, the condition that respective variation amplitudes of the variations Δw and Δt do not simultaneously take maximum values is imposed. Specifically, the condition represented by the above-mentioned Equation (1) is imposed. The variation Δs1 of the film thickness s1 immediately above the main interconnection 10 is set to a positive fixed value "+3σs1×γ", and the variation Δs2 of the film thickness s2 immediately below the main interconnection 10 is Set to a positive fixed value "+3σs2×γ". This is because it has turned out from the result of the above-described sensitivity analysis that the parasitic capacitance C is in inverse proportion to the film thickness s1, s2. Meanwhile, the variation Δsi of the film thickness si (i=3 to n) in each of the other layers belonging to the contact structure 20 is set to a negative fixed value "−3σs×γ". This is because it has turned out from the result of the above-described sensitivity analysis that the parasitic capacitance C is proportional to the film thickness si. The variation Δε of the electric permittivity ε of the interlayer insulating film 5 is set to a negative fixed value "−3σε". Variations of the other parameters are set to 0.

The parasitic capacitance C of the interconnect structure 1 is calculated under each of the set conditions shown in FIG. 13. Here, the TCAD is used for calculating the parasitic capacitance C. That is to say, the parasitic capacitance C of the interconnect structure 1 (word interconnect structure, bit interconnect structure) is calculated through the "three-dimensional electromagnetic analysis" of the unit structure shown in FIG. 4. By the three-dimensional electromagnetic analysis by using the TCAD, the parasitic capacitance C can be calculated with high precision. The parasitic capacitance C of the interconnect structure 1 calculated under the center condition is Ctyp.

Figure 14:
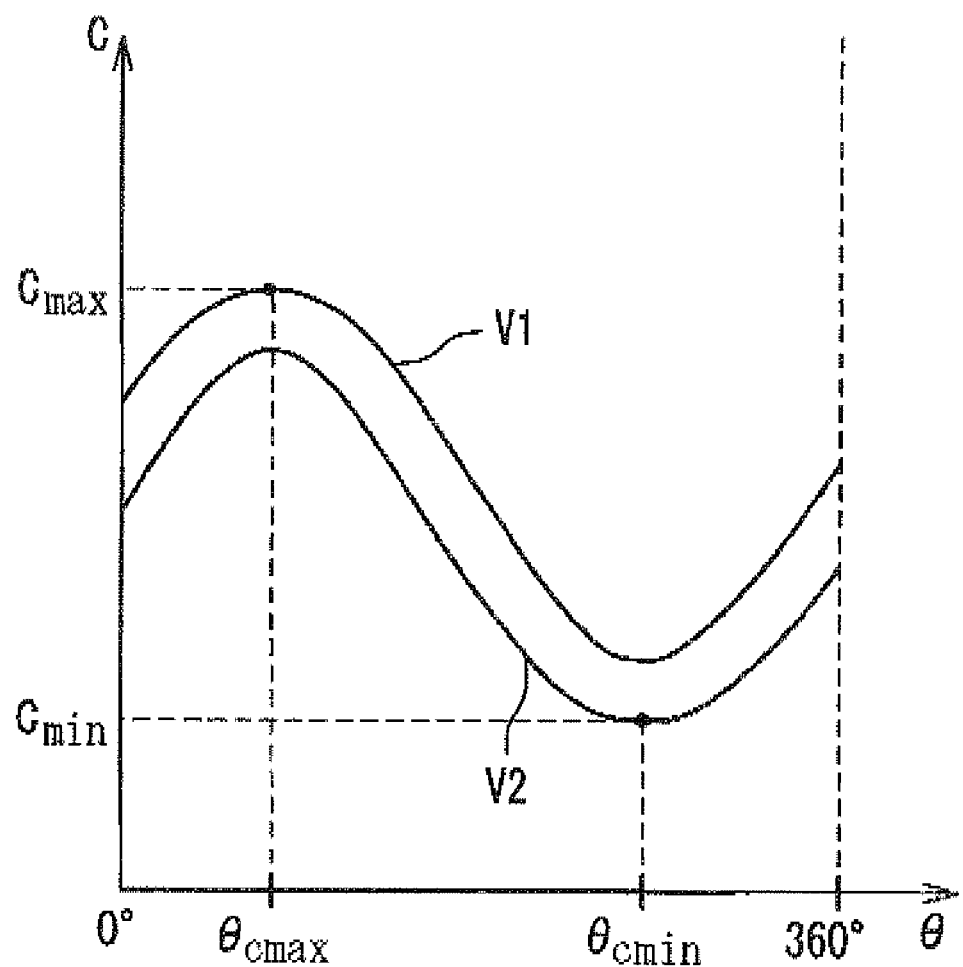
FIG. 14 is a graph showing variation in the parasitic capacitance of the interconnect structure.

FIG. 14 shows the parasitic capacitance C calculated under the above-mentioned Cmax condition and Cmin condition. The vertical axis represents the calculated parasitic capacitance C, and the horizontal axis represents the angle θ (see FIG. 11) that specifies a point on the circle of equal probability CEP. When the angle θ is changed, namely, when the variations Δw and Δt are changed under the condition represented by the above Equation (1), the parasitic capacitance C also is changed accordingly. In FIG. 14, a curve V1 represents the change in the parasitic capacitance C under the Cmax condition, and a curve V2 represents the change in the parasitic capacitance C under the Cmin condition. The maximum point on the curve V1 corresponds to the maximum capacitance value Cmax, and the minimum point on the curve V2 corresponds to the minimum capacitance value Cmin. Note that a preferable method of searching for the maximum capacitance value Cmax and the minimum capacitance value Cmin is described in Japanese Laid-Open Patent Application JP-2009-283647 (not yet published on the priority date) by the inventor of the present application.

In this manner, the center value Ctyp and the corner values Cmax and Cmin are calculated (extracted) with regard to the parasitic capacitance C of the interconnect structure 1. A correction parameter βcmax related to the maximum capacitance value Cmax and a correction parameter βcmin related to the minimum capacitance value Cmin are respectively calculated as follows.

βcmax=Cmax/Ctyp

βcmin=Cmin/Ctyp

In the case of the structure shown in FIG. 4, the above-described Ctyp, Cmax (βcmax) and Cmin ((βcmin) are calculated with respect to each of the word interconnect structure including the word line WD and the bit interconnect structure including the bit line BIT.

It should be noted that a coupling capacitance between the word interconnect structure and the bit interconnect structure is calculated as follows. Coupling components of the maximum capacitance value Cmax and the minimum capacitance value Cmin related to the word interconnect structure are Ccp_wdmax and Ccp_wdmin, respectively. Similarly, coupling components of the maximum capacitance value Cmax and the minimum capacitance value Cmin related to the bit interconnect structure are Ccp_bitmax and Ccp_bitmin, respectively. In this case, a maximum value Ccp_max of the coupling capacitance is the larger one of Ccp_wdmax and Ccp_bitmax. A minimum value Ccp_min of the coupling capacitance is the smaller one of Ccp_wdmin and Ccp_bitmin.

3-4. Extraction of Interconnect Resistance R

Figure 15:
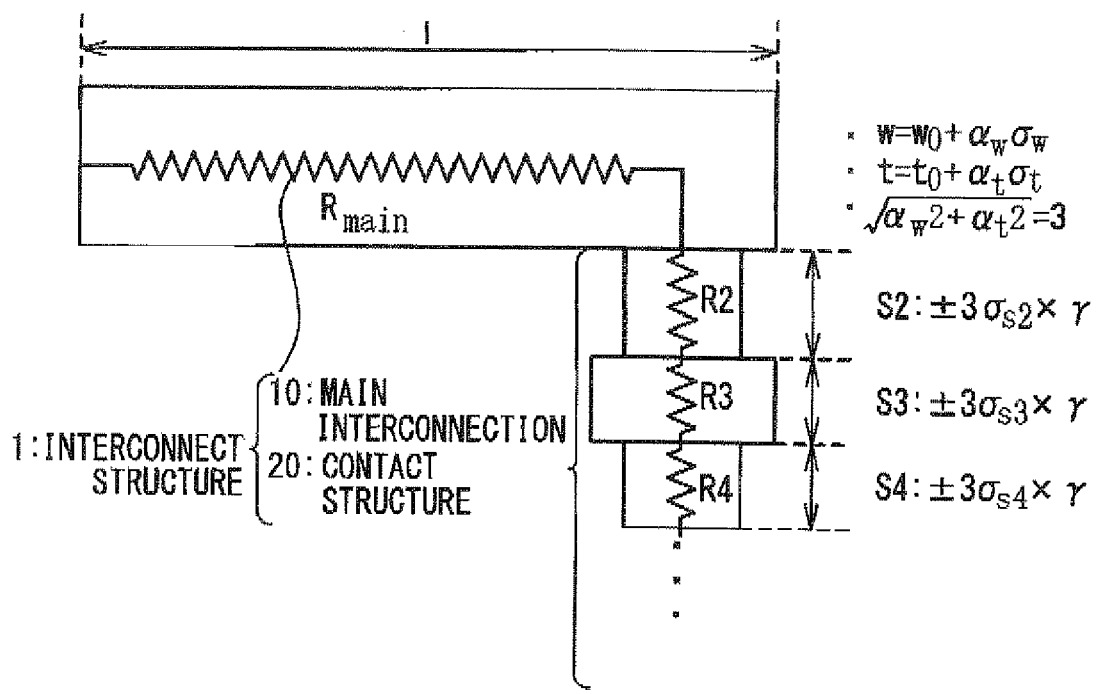
FIG. 15 is a conceptual diagram showing an interconnect structure and parameters contributing to the interconnect resistance of the interconnect structure.

A method of calculating the interconnect resistance R of the interconnect structure 1 according to the present embodiment will be described below with reference to FIG. 15. The interconnect resistance R of the interconnect structure 1 is expressed by a sum of a resistance value Rmain of the main interconnection 10 and a resistance value Rcontact of the contact structure 20.

[Equation. 3]

$$R = Rmain + Rcontact = Rmain + \sum_{i=2}^{n} Ri \quad (3)$$

The resistance value Rmain of the main interconnection 10 is calculated in accordance with an equation: $Rmain = \rho \times l/(w \times t)$. Here, $\rho$ is electrical resistivity (unit: $\Omega m$), and l is a length of the main interconnection 10.

The resistance value Rcontact of the contact structure 20 is expressed by a sum of respective resistance values Ri (i=2 to n) of the layers of the contact structure 20. Here, the contact structure 20 is regarded as an interconnection extending in the Z-direction. Therefore, the film thickness si (i=2 to n) of each layer of the contact structure 20 corresponds to an interconnect length (length in the Z-direction) in the each layer. When a cross-sectional area of the via is "Sv", the resistance value Ri is calculated in accordance with an equation: $Ri = \rho \times si/Sv$.

Figure 16:
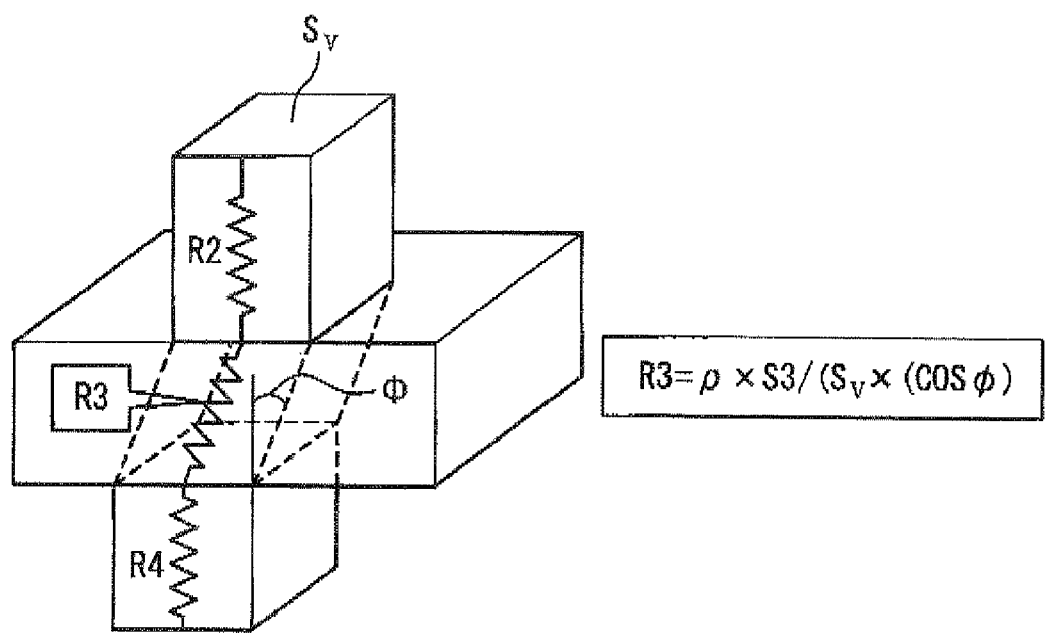
FIG. 16 is a conceptual diagram showing a method of calculating a resistance value of the contact structure.

It should be noted that a resistance value of an interconnection (cushion interconnection) formed in an interconnection layer sandwiched between vias in the contact structure 20 is approximately calculated based on an envisioned current path. That is, as shown in FIG. 16, a resistance value R3 of an interconnection formed in an interconnection layer is calculated as a resistance value of an interconnection that has the cross-sectional area Sv and connects between the upper and lower vias. Here, positions of the upper and lower vias may be different from each other. Therefore, the resistance value R3 is calculated in accordance with an equation: $R3 = \rho \times s3/(Sv \times \cos \phi)$, as shown in FIG. 16. In a case where the upper and lower vias are aligned in the Z-direction (p=0), the current path goes straight and thus the resistance value R3 is calculated to be $\rho \times s3/Sv$. The same applies to a case where the positions of the upper and lower vias are different from each other in both the X-direction and the Y-direction. When respective inclinations from the Z-axis toward the X-direction and the Y-direction are represented by angles $\phi x$ and $\phi y$, the resistance value R3 is calculated in accordance with an equation: $R3 = \rho \times s3/(Sv \times \cos \phi x \times \cos \phi y)$.

Extraction of a maximum value Rmax and a minimum value Rmin of the interconnect resistance R of the interconnect structure 1 is performed in consideration of the manufacturing variability. Here, the parameters whose manufacturing variability is considered include the interconnect width w and the interconnect thickness t of the main interconnection 10 and the film thickness si (i=2 to n) of each layer of the contact structure 20. FIG. 17 shows set conditions of the variation of each parameter from the design value at the extraction processing.

(Center Condition)

In the center condition, the variations of the all parameters are set to 0.

(Rmax Condition)

A condition under which the maximum resistance value Rmax is extracted is as follows. As to the main parameters, namely, the interconnect width w and the interconnect thickness t of the main interconnection 10, the condition that respective variation amplitudes of the variations $\Delta w$ and $\Delta t$ do not simultaneously take maximum values is imposed. Specifically, the condition represented by the above-mentioned Equation (1) is imposed. The variation $\Delta si$ of the film thickness si (i=2 to n) of each layer is set to a positive fixed value "$+3\sigma si \times \gamma$". Variations of the other parameters are set to 0.

(Rmin Condition)

A condition under which the minimum resistance value Rmin is extracted is as follows. As to the main parameters, namely, the interconnect width w and the interconnect thickness t of the main interconnection 10, the condition that respective variation amplitudes of the variations $\Delta w$ and $\Delta t$ do not simultaneously take maximum values is imposed. Specifically, the condition represented by the above-mentioned Equation (1) is imposed. The variation $\Delta si$ of the film thickness si (i=2 to n) of each layer is set to a negative fixed value "$-3\sigma si \times \gamma$". Variations of the other parameters are set to 0.

The interconnect resistance R of the interconnect structure 1 is calculated under each of the set conditions shown in FIG. 17. The interconnect resistance R of the interconnect structure 1 calculated under the center condition is Rtyp.

Figure 18:
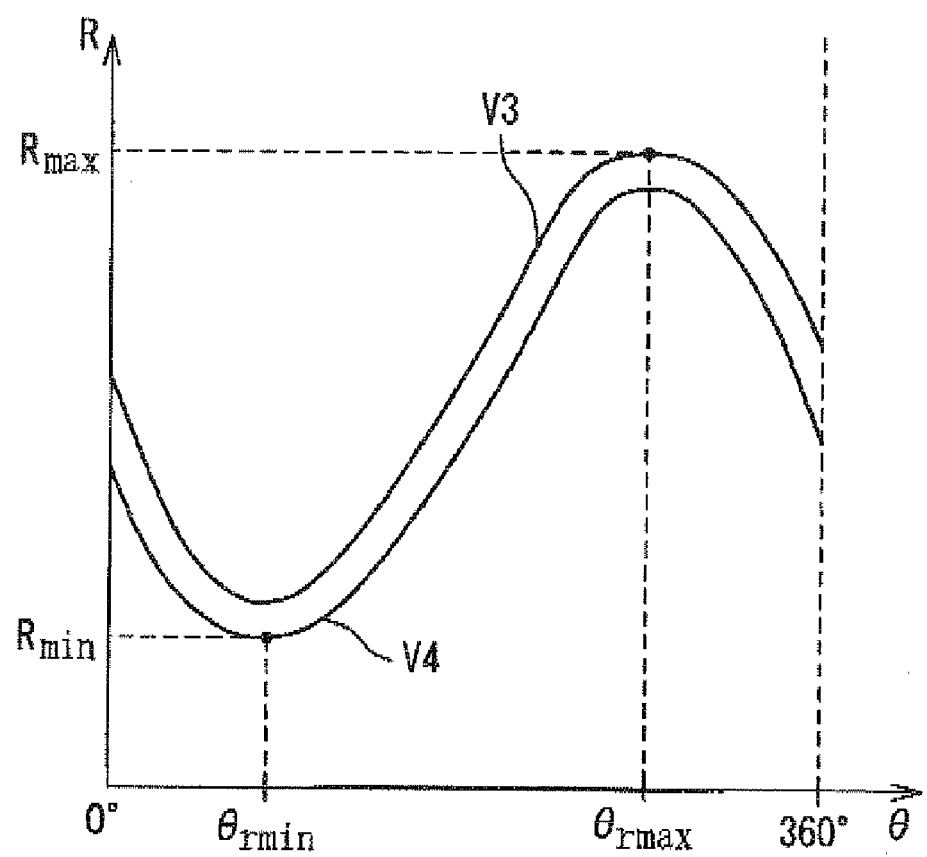
FIG. 18 is a graph showing variation in the interconnect resistance of the interconnect structure.

FIG. 18 shows the interconnect resistance R calculated under the above-mentioned Rmax condition and Rmin condition. The vertical axis represents the calculated interconnect resistance R, and the horizontal axis represents the angle $\theta$ (see FIG. 11) that specifies a point on the circle of equal probability CEP. When the angle $\theta$ is changed, namely, when the variations $\Delta w$ and $\Delta t$ are changed under the condition represented by the above Equation (1), the interconnect resistance R also is changed accordingly. In FIG. 18, a curve V3 represents the change in the interconnect resistance R under the Rmax condition, and a curve V4 represents the change in the interconnect resistance R under the Rmin condition. The maximum point on the curve V3 corresponds to the maximum resistance value Rmax, and the minimum point on the curve V4 corresponds to the minimum resistance value Rmin. Note that a preferable method of searching for the maximum resistance value Rmax and the minimum resistance value Rmin is described in Japanese Laid-Open Patent Application JP-2009-283647 (not yet published on the priority date) by the inventor of the present application.

In this manner, the center value Rtyp and the corner values Rmax and grain are calculated (extracted) with regard to the interconnect resistance R of the interconnect structure 1. A correction parameter $\beta rmax$ related to the maximum resistance value Rmax and a correction parameter $\beta rmin$ related to the minimum resistance value Rmin are respectively calculated aa follows.

$\beta rmax = Rmax/Rtyp$ $\beta rmin = Rmin/Rtyp$

In the case of the structure shown in FIG. 4, the above-described Rtyp, Rmax ($\beta rmax$) and Rmin ($\beta rmin$) are calculated with respect to each of the word interconnect structure including the word line WD and the bit interconnect structure including the bit line BIT.

3-5. Generation of CR-Added Cell Netlist

The interconnect structure 1 shown in FIG. 4 is for driving the cell transistor included in the memory cell. A netlist indicating a connection relationship in the cell array is hereinafter referred to as a "cell netlist". A "CR-added cell netlist"

can be generated by adding the parasitic capacitance C and the interconnect resistance R to a net corresponding to the interconnect structure 1 in the cell netlist. At this time, the above-described center values Ctyp and Rtyp and the corner values Cmax, Cmin, Rmax and Rmin are used. In general, the parasitic capacitance C and the interconnect resistance R have an inverse relationship. Therefore, when the maximum capacitance value Cmax is added to the net, the minimum resistance value Rmin is added to the same net. On the other hand, when the minimum capacitance value Cmin is added to the net, the maximum resistance value Rmax is added to the same net.

FIG. 19 shows various examples of the CR combination added to the word interconnect structure and the bit interconnect structure. In FIG. 19, Ctyp_wd, Cmax_wd, Cmin_wd, Rtyp_wd, Rmax_wd and Rmin_wd are Ctyp, Cmax, Cmin, Rtyp, Rmax and Rmin of the word interconnect structure, respectively. Also, Ctyp_bit, Cmax_bit, Cmin_bit, Rtyp_bit, Rmax_bit and Rmin_bit are Ctyp, Cmax, Cmin, Rtyp, Rmax and Rmin of the bit interconnect structure, respectively.

By using the CR-added cell netlist, a circuit designer can perform operation verification (timing verification, delay verification) of the semiconductor device. At this time, the operation verification of the semiconductor device in a desired case can be performed by using the CR-added cell netlist corresponding to the desired case. For example, the various kinds of the CR-added cell netlists as shown in FIG. 19 are provided as a library, and one corresponding to the desired case is appropriately selected from the library.

3-6. CR Extraction System

Figure 20:
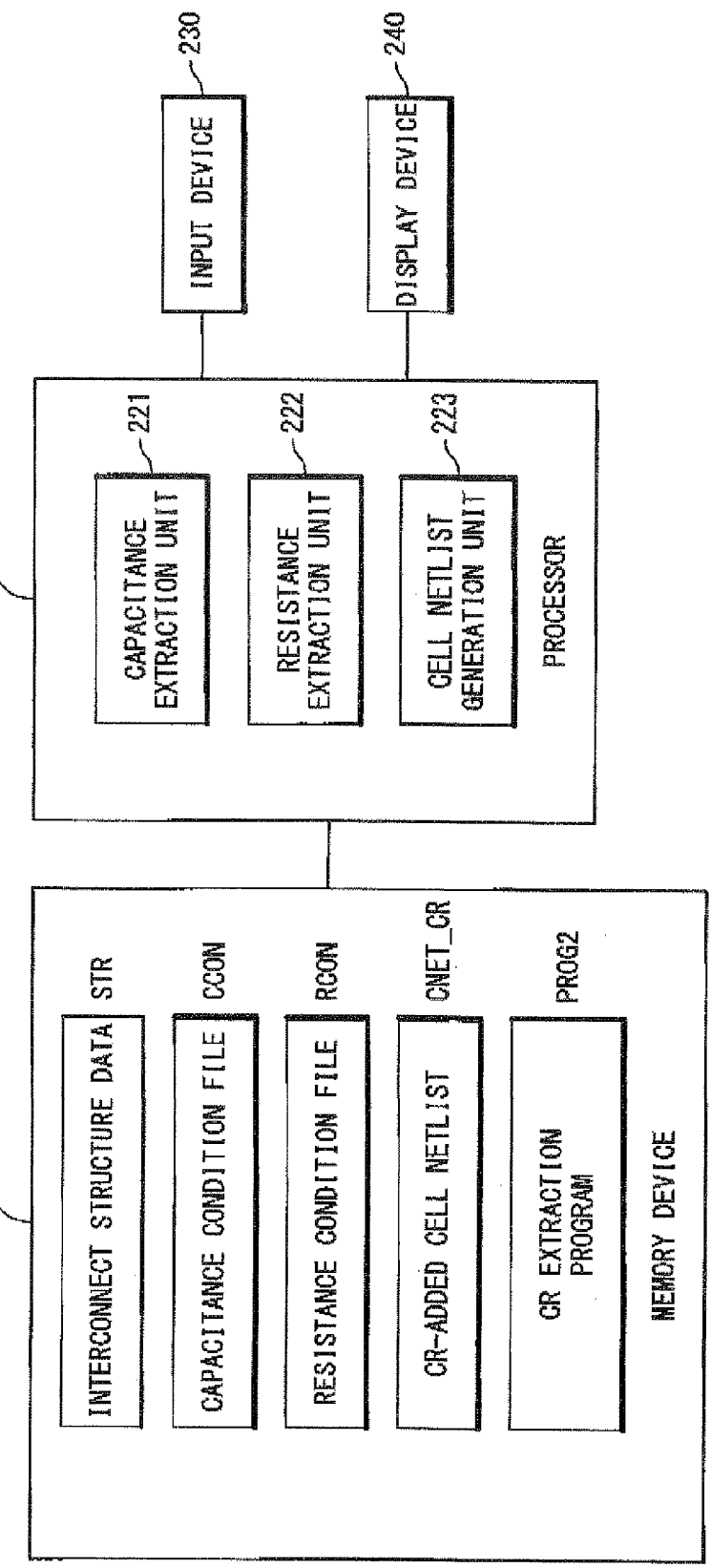
FIG. 20 is a block diagram showing a configuration of a CR extraction system according to the embodiment of the present invention.

The CR extraction processing for the interconnect structure 1 according to the present embodiment can be achieved by a computer system. FIG. 20 is a block diagram showing a configuration of a CR extraction system 200 that executes the CR extraction processing according to the present embodiment. The CR extraction system 200 has a memory device 210, a processor 220, an input device 230 and a display device 240.

An interconnect structure data STR, a capacitance condition file CCON and a resistance condition file RCON are stored in the memory device 210. The interconnect structure data STIR indicates the interconnect structure (layout, process cross-section) shown in FIG. 4. The capacitance condition file CCON indicates the set conditions of the variation of each parameter at the time of the capacitance extraction as shown in FIG. 13. The resistance condition file RCON indicates the set conditions of the variation of each parameter at the time of the resistance extraction as shown in FIG. 17.

A CR extraction program PROG2 is a computer program executed by the processor 220. The CR extraction program PROG2 is stored in the memory device 210. The CR extraction program PROG2 may be stored in a computer-readable recording medium.

The processor 220 performs the CR extraction processing according to the present embodiment by executing the CR extraction program PROG2. More specifically, a capacitance extraction unit 221, a resistance extraction unit 222 and a cell netlist generation unit 223 are achieved by cooperation of the processor 220 and the CR extraction program PROG2. These function blocks perform the following processing.

Figure 21:
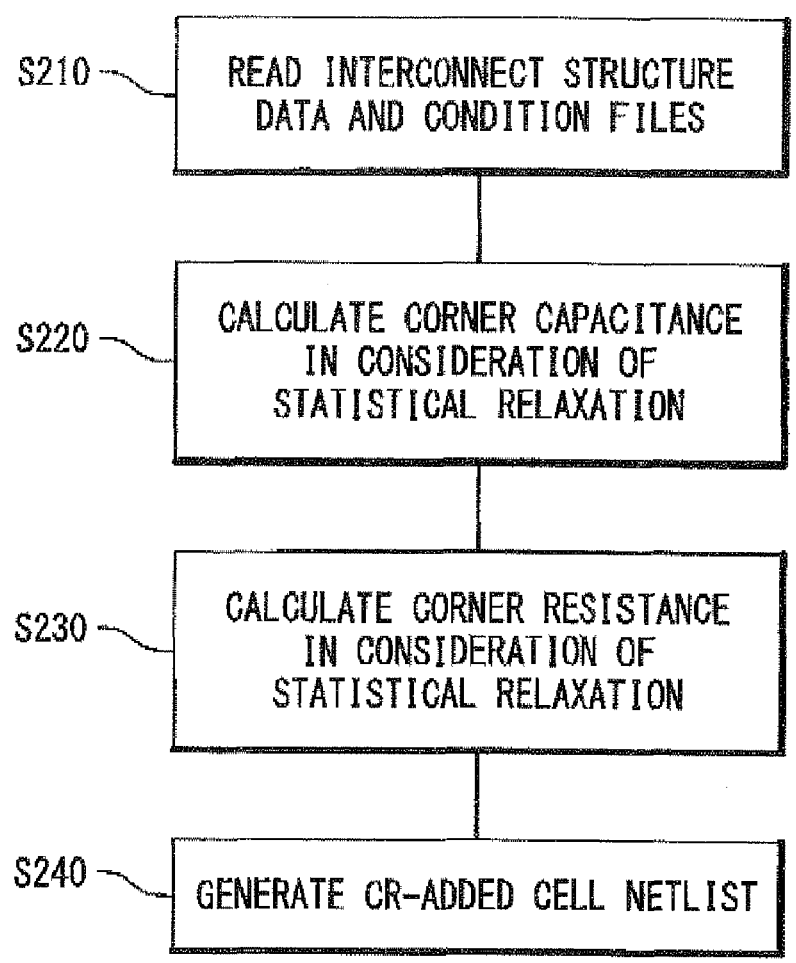
FIG. 21 is a flow chart showing a method of CR extraction according to the embodiment of the present invention.

FIG. 21 is a flow chart showing the CR extraction processing according to the present embodiment.

Step S210;

The capacitance extraction unit 221 reads the interconnect structure data STR and the capacitance condition file CCON from the memory device 210. Also, the resistance extraction unit 222 reads the interconnect structure data STR and the resistance condition file RCON from the memory device 210.

Step S220;

The capacitance extraction unit 221 performs the extraction of the parasitic capacitance C of the interconnect structure 1 in accordance with the statistical relaxation method of the present embodiment. More specifically, the capacitance extraction unit 221 sets the variation of each parameter of the interconnect structure 1 to each of the plurality of conditions (refer to FIG. 13) described in the capacitance condition file CCON. The capacitance extraction unit 221 performs the three-dimensional electromagnetic analysis of the interconnect structure 1 by using the set parameters, and thereby calculates (extracts) the center value Ctyp and the corner values Cmax and Cmin of the parasitic capacitance C of the interconnect structure 1.

Step S230;

The resistance extraction unit 222 performs the extraction of the interconnect resistance R of the interconnect structure 1 in accordance with the statistical relaxation method of the present embodiment. More specifically, resistance extraction unit 222 sets the variation of each parameter of the interconnect structure 1 to each of the plurality of conditions prefer to FIG. 17) described in the resistance condition file RCON. The resistance extraction unit 222 uses the set parameters to calculate (extract) the center value Rtyp and the corner values Rmax and Rmin of the interconnect resistance R of the interconnect structure 1.

Step S240:

The cell netlist generation unit 223 generates the CR-added cell netlist CNET_CR by using the calculated center values Ctyp and Rtyp and corner values Cmax, Cmin, Rmax and Rmin. At this time, the cell netlist generation unit 223 may generate the CR-added cell netlists CNET_CR for various CR combinations as shown in FIG. 19. The cell netlist generation unit 223 stores the CR-added cell netlist CNET_CR in the memory device 210.

4. Designing of Semiconductor Device

Next, a method of designing a semiconductor device will be described. As an example, let us consider a semiconductor device including an SRAM macro.

Figure 22:
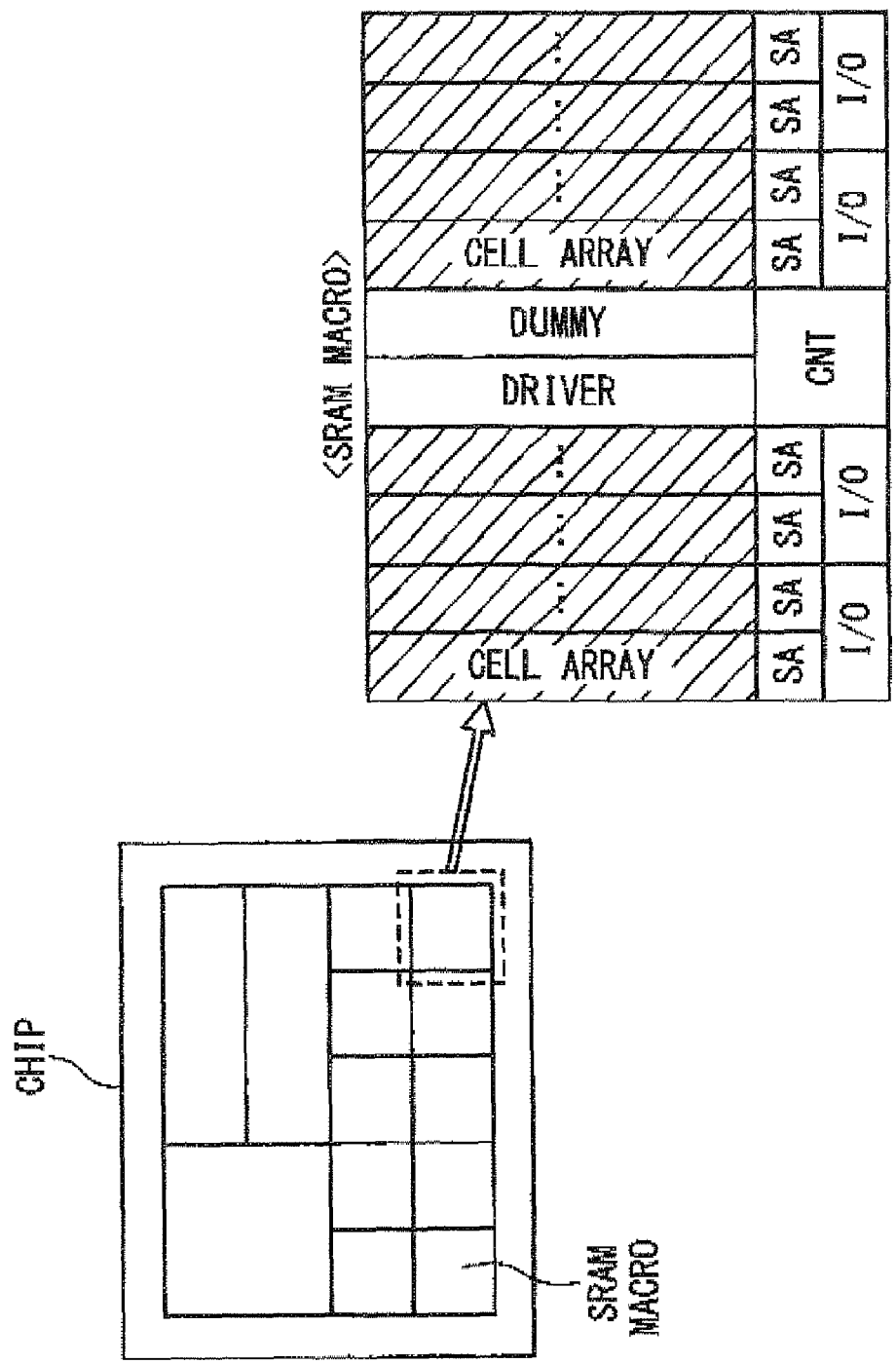
FIG. 22 is a schematic diagram showing a configuration of a SRAM macro.

FIG. 22 shows a semiconductor device including an SRAM macro and a configuration of the SRAM macro. The SRAM macro is provided with a cell, array and a peripheral section. The cell array (CELL_ARRAY) has a plurality of memory cells CELL arranged in an array form as shown in FIG. 2 and functions as a data memory unit. The peripheral section is for controlling an operation of the SRAM and is placed around the cell array. The peripheral section includes a driver (DRIVER), a sense amplifier (SA), a data input/output unit (I/O), a controller (CNT) and so forth.

Figure 23:
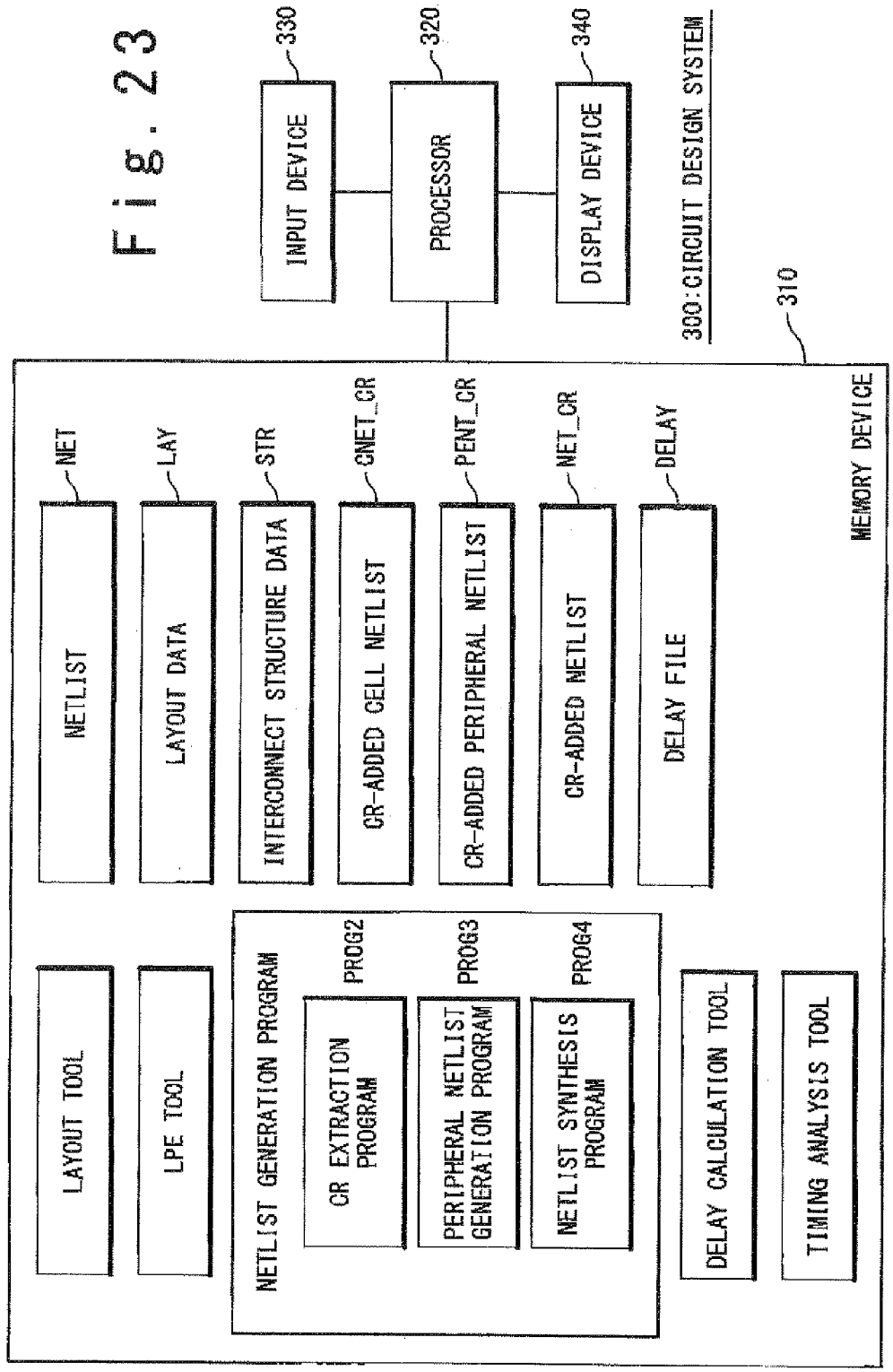
FIG. 23 is a block diagram showing a configuration of a circuit design system according to the embodiment of the present invention.

Circuit design processing according to the present embodiment can be achieved by a computer system. FIG. 23 is a block diagram showing a configuration of a circuit design system 300 executing the circuit design processing according to the present embodiment. The circuit design system 300 has a memory device 310, a processor 320, an input device 330 and a display device 340.

A layout tool, an LPE tool, a netlist generation program, a delay calculation tool, a timing analysis tool and the like are stored in the memory device 310, The netlist generation program includes a peripheral netlist generation program PROG3 and a netlist synthesis program PROG4 in addition to the above-mentioned CR extraction program PROG2. These tools and programs are computer programs executed by the processor 320. These tools and programs may be stored in a computer-readable recording medium. The processor 320 executes these tools and programs to perform the circuit design processing according to the present embodiment.

Figure 24:
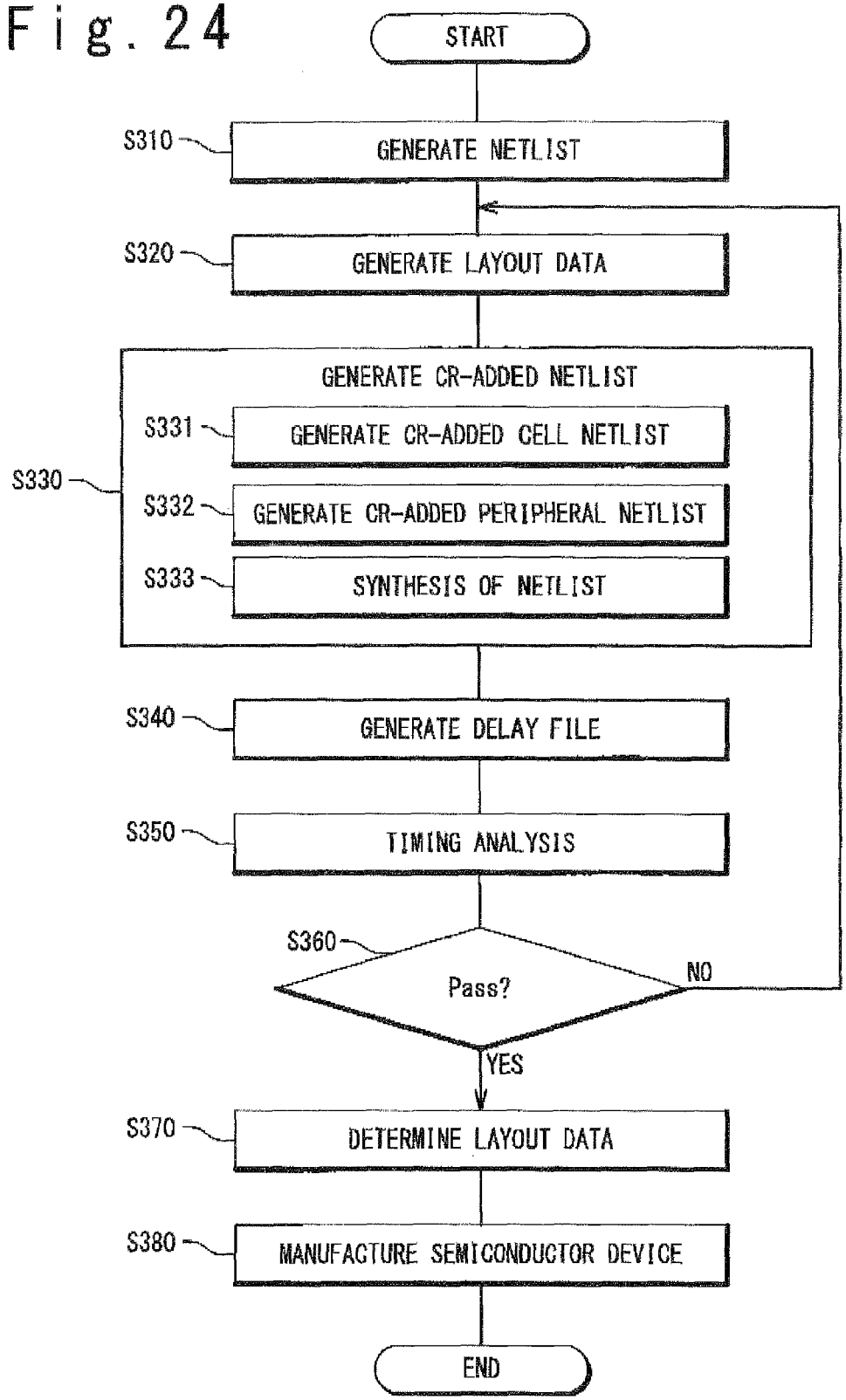
FIG. 24 is a flow chart showing a method of designing and a method of manufacturing the semiconductor device according to the embodiment of the present invention.

FIG. 24 is a flow chart showing the circuit design processing and a method of manufacturing a semiconductor device according to the present embodiment.

Step S310:

A netlist NET of the SRAM macro is generated through logic synthesis and so on. The netlist NET can be classified into the cell netlist that is a netlist of the cell array and a peripheral netlist that is a netlist of the peripheral section. The generated netlist NET is stored in the memory device 310. A netlist and a layout data of an SRAM cell may be separately generated prior to the generation of the netlist NET of the SRAM macro.

Step S320:

The layout tool reads the netlist NET from the memory device 310 and determines a layout of the SRAM macro corresponding to the netlist NET. The layout can be classified into a layout of the cell array and a layout of the peripheral section. A layout data LAY indicating the determined layout is stored in the memory device 310. Moreover, the interconnect structure data STR indicating the interconnect structure shown in FIG. 4 is generated based on the layout of the cell array and the process cross-section. The generated interconnect structure data STR is stored in the memory device 310.

Step S330:

Next, the CR extraction processing for the SRAM macro is performed based on the determined layout. As a result, the "CR-added netlist NET_CR" in which the parasitic capacitance C and the interconnect resistance R are added to the netlist NET is generated.

According to a typical circuit design flow, the CR extraction processing is performed by the LPE tool. However, in the typical LPE tool, computation precision is deteriorated instead of improving processing speed. On the other hand, according to the three-dimensional electromagnetic analysis by the use of the TCAD as described in the present embodiment, it is possible to extract the parasitic capacitance C with high precision. Therefore, in the present embodiment, different CR extraction methods are employed depending on the target. More specifically, as for the cell array, the high-precision CR extraction is performed in accordance with the method described in the above Section 3. As for the peripheral section, on the other hand, the high-speed CR extraction is performed by using the LPE tool.

Step S331:

The CR extraction program PROG2 extracts the parasitic capacitance C and the interconnect resistance R of the interconnect structure 1 in the cell array in accordance with the method described in the above Section 3. As a result, the CR-added cell netlist CNET_CR in which the extracted CR is added to the cell netlist is generated. The generated CR-added cell netlist CNET_CR is stored in the memory device 310.

Step S332:

As for a random layout of the peripheral section, the parasitic capacitance C and the interconnect resistance R are extracted through the LPE. More specifically, the peripheral netlist generation program PROG3 reads the layout data LAY from the memory device 310 and performs the LPE based on the layout of the peripheral section. At this time, the peripheral netlist generation program PROG3 utilizes the LPE tool as appropriate. Moreover, it is preferable at this time that the statistical relaxation is considered in accordance with the method described in Japanese Laid-Open Patent Application JP-2006-209702 or Japanese Laid-Open Patent Application JP-2008-028161. In this manner, the CR extraction for the peripheral section is performed through the LPE, and consequently a CR-added peripheral netlist PNET_CR in which the extracted CR is added to the peripheral netlist is generated. The generated CR-added peripheral netlist PNET_CR is stored in the memory device 310.

Step S333:

The netlist synthesis program PROG4 reads the CR-added cell netlist CNET_CR and the CR-added peripheral netlist PNET_CR from the memory device 310. Then, the netlist synthesis program PROG4 combines the CR-added cell netlist CNET_CR and the CR-added peripheral netlist PNET_CR to generate the CR-added netlist NET_CR. The generated CR-added netlist NET_CR is stored in the memory device 310.

Step S340:

Next, the operation verification such as the delay verification and the timing verification is performed by using the generated CR-added netlist NET_CR. To this end, the delay calculation tool reads the CR-added netlist NET_CR from the memory device 310 and calculates a delay value of each net included in the CR-added netlist NET_CR. Then, the delay calculation tool generates a delay file DELAY indicating the calculated delay value of each net. The generated delay file DELAY is stored in the memory device 310.

Step S350:

The timing analysis tool reads the CR-added netlist NET_CR and the delay file DELAY from the memory device 310. Then, the timing analysis tool performs the timing analysis such as STA (Static Timing Analysis).

Step S360;

In a case where the timing analysis results in FAIL (Step S360; No), the processing returns back to the upstream Step S320 and modification of the layout is performed. Such returning-back is not preferable in terms of the design TAT. However, to consider the manufacturing variability during the timing verification means that a condition to be met in the timing verification becomes stricter. As the condition becomes stricter, the timing verification is more likely to result in FAIL and thus the number of circuit design modification times increases. This causes increase in the design TAT.

In the CR extraction processing according to the present embodiment, the manufacturing variability is statistically relaxed and unrealistic extreme situations are excluded from the consideration. Thus, it is not necessary to repeat circuit designing for supporting such extreme situations. It is therefore possible to perform the high-precision timing verification considering the manufacturing variability while suppressing increase in the design TAT.

Step S370:

In a case where the timing analysis results PASS (Step S360; Yes), a conclusive layout data LAY is determined.

Step S380:

After that, the semiconductor device is manufactured based on the determined layout data LAY.

5. Summary

According to the present embodiment, influence of the manufacturing variability of the contact structure 20 also is taken into consideration in the CR extraction processing. With increasing miniaturization of a semiconductor device in recent years, an interval between adjacent contact structures 20 is getting narrower. Such tendency is conspicuous, for example, in a memory macro in which a large number of cell transistors are integrated. When the interval between adjacent contact structures 20 becomes narrower, the influence of the manufacturing variability of the contact structure 20 on the parasitic capacitance C becomes significant and nonnegligible. In these circumstances, the technique according to the present embodiment is particularly useful and enables the CR extraction with high precision in consideration of the manufacturing variability of the contact structure 20.

Moreover, in the CR extraction processing according to the present embodiment, the manufacturing variability is statistically relaxed and unrealistic extreme situations are excluded from the consideration. Thus, it is not necessary to repeat circuit designing for supporting such extreme situations. It is possible to suppress increase in the design TAT while considering the manufacturing variability.

Furthermore, according to the present embodiment, the sensitivity analysis as described in the Section 2 is performed beforehand. In the CR extraction processing, the variation ΔPk of each parameter Pk is suitably set based on the results of the sensitivity analysis. For example, the statistical relaxation as shown in FIG. 11 is applied only to the main parameters that greatly contribute to the parasitic capacitance C. On the other hand, the variation of the sub parameter less contributing to the parasitic capacitance C is set to a predetermined fixed value. Here, plus and minus of the predetermined fixed value also is suitably set based on the results of the sensitivity analysis. In this manner, unnecessary increase in computation load in the CR extraction processing can be prevented without deteriorating the precision. That is, both of the precision and the design TAT can be satisfied.

Furthermore, according to the present embodiment, different CR extraction methods are employed for different targets. Specifically, as for the cell array, the high-precision CR extraction is performed by using the TCAD (refer to the Section 3). As for a random layout in the peripheral section, on the other hand, the high-speed CR extraction is performed through the LPE. As a result, both of the precision and the design TAT can be satisfied.

In the above description, the SRAM is used as an example. The same applies to DRAM, eDRAM, flash memory and the like.

The embodiments of the present invention have been described above with reference to the attached drawings. It is apparent that the present invention is not limited to the above embodiments and may be modified and changed without departing from the scope and spirit of the invention.

What is claimed is:

1. A method of designing a semiconductor device,
said semiconductor device comprising an interconnect structure,
wherein said interconnect structure comprises:
a main interconnection formed in an interconnection layer; and
a contact structure electrically connected to said main interconnection and extending from said main interconnection toward a semiconductor substrate,
wherein a plurality of parameters contributing to parasitic capacitance and interconnect resistance of said interconnect structure comprise:
a plurality of main parameters including a width and a thickness of said main interconnection; and
at least one sub parameter different from said plurality of main parameters,
wherein variation of each of said plurality of parameters from a design value caused by manufacturing variability is represented within a predetermined range, and
wherein a maximum value and a minimum value of the parasitic capacitance of said interconnect structure are a maximum capacitance value and a minimum capacitance value, respectively, and a maximum value and a minimum value of the interconnect resistance of said interconnect structure are a maximum resistance value and a minimum resistance value, respectively,
the method comprising:
reading an interconnect structure data indicating said interconnect structure from a memory device;
calculating said maximum capacitance value, said minimum capacitance value, said maximum resistance value and said minimum resistance value under a condition that respective variation amplitudes of said plurality of main parameters do not simultaneously take maximum values and variation of said sub parameter is fixed to a predetermined value;
generating by using a computer, by using said maximum capacitance value, said minimum capacitance value, said maximum resistance value and said minimum resistance value, a CR-added netlist in which the parasitic capacitance and the interconnect resistance are added to a net of said interconnect structure; and
performing operation verification of said semiconductor device by using said CR-added netlist.

2. The method according to claim 1,
wherein a layer placed immediately above said interconnection layer is a first layer, and a layer placed immediately below said interconnection layer is a second layer,
wherein said at least one sub parameter comprises;
a first film thickness that is a film thickness of an interlayer insulating film in said first layer; and
a second film thickness that is a film thickness of an interlayer insulating film in said second layer,
wherein the variation of said first film thickness from the design value is represented within a range from $-\delta s1$ to $+\delta s1$,
the variation of said second film thickness from the design value is represented within a range from $-\delta s2$ to $+\delta s2$, and
a relaxation coefficient γ is more than 0 and not more than 1,
wherein when said maximum capacitance value is calculated, the variation of said first film thickness is fixed to $-\delta s1 \times \gamma$ and the variation of said second film thickness is fixed to $-\delta s2 \times \gamma$, and
wherein when said minimum capacitance value is calculated, the variation of said first film thickness is fixed to $+\delta s1 \times \gamma$ and the variation of said second film thickness is fixed to $+\delta s2 \times \gamma$.

3. The method according to claim 2,
wherein third to n-th (n is an integer equal to or more than 3) layers are placed in this order below said second layer,
said contact structure has a stacked structure in which conductors respectively formed in said second to n-th layers are stacked,
said at least one sub parameter further comprises an i-th film thickness that is a film thickness of an interlayer insulating film in the i-th layer (i=3 to n), and
the variation of said i-th film thickness from the design value is represented within a range from $-\delta si$ to $+\delta si$,
wherein when said maximum capacitance value is calculated, the variation of said i-th film thickness is fixed to $+\delta si \times \gamma$, and
wherein when said minimum capacitance value is calculated, the variation of said i-th film thickness is fixed to $-\delta si \times \gamma$.

4. The method according to claim 3,
wherein the interconnect resistance of said interconnect structure is a sum of a resistance value of said main interconnection and a resistance value of said contact structure, wherein when said maximum resistance value is calculated, the variation of the j-th film thickness (j=2 to n) is fixed to $+\delta s_j \times \gamma$, and wherein when said minimum resistance value is calculated, the variation of the j-th film thickness is fixed to $-\delta s_j \times \gamma$.

5. The method according to claim 1, wherein the variation of said width of said main interconnection from the design value is represented by $\alpha w \times \sigma w$, the variation of said thickness of said main interconnection from the design value is represented by $\alpha t \times \sigma t$, $\sigma w$ and $\sigma t$ are standard deviations of distributions of said width and said thickness, respectively, and said condition that respective variation amplitudes of said plurality of main parameters do not simultaneously take maximum values is represented by $\alpha w^2 + \alpha t^2 =$ constant.

6. The method according to claim 1, wherein said semiconductor device comprises a memory, said interconnect structure drives a cell transistor included in a memory cell of said memory, and said main interconnection is a word line or a bit line that is connected to said cell transistor through said contact structure.

7. The method according to claim 6, wherein said memory comprises:

a cell array including said memory cell; and a peripheral section placed around said cell array and configured to control an operation of said memory, wherein said generating said CR-added netlist comprises:

generating, by using said maximum capacitance value, said minimum capacitance value, said maximum resistance value and said minimum resistance value, a CR-added cell netlist in which the parasitic capacitance and the interconnect resistance are added to a netlist of said cell array;

generating, through layout parameter extraction, a CR-added peripheral netlist in which parasitic capacitance and interconnect resistance are added to a netlist of said peripheral section; and combining said CR-added cell netlist and said CR-added peripheral netlist to generate said CR-added netlist.

8. A design program recorded on a non-transitory computer-readable recording medium that, when executed, causes a computer to perform a method of designing a semiconductor device, said semiconductor device comprising an interconnect structure, wherein said interconnect structure comprises:

a main interconnection formed in an interconnection layer; and a contact structure electrically connected to said main interconnection and extending from said main interconnection toward a semiconductor substrate, wherein a plurality of parameters contributing to parasitic capacitance and interconnect resistance of said interconnect structure comprise:

a plurality of main parameters including a width and a thickness of said main interconnection; and at least one sub parameter different from said plurality of main parameters, wherein variation of each of said plurality of parameters from a design value caused by manufacturing variability is represented within a predetermined range, and wherein a maximum value and a minimum value of the parasitic capacitance of said interconnect structure are a maximum capacitance value and a minimum capacitance value, respectively, and a maximum value and a minimum value of the interconnect resistance of said interconnect structure are a maximum resistance value and a minimum resistance value, respectively, the method comprising:

reading an interconnect structure data indicating said interconnect structure from a memory device;

calculating said maximum capacitance value, said minimum capacitance value, said maximum resistance value and said minimum resistance value under a condition that respective variation amplitudes of said plurality of main parameters do not simultaneously take maximum values and variation of said sub parameter is fixed to a predetermined value;

generating, by using said maximum capacitance value, said minimum capacitance value, said maximum resistance value and said minimum resistance value, a CR-added netlist in which the parasitic capacitance and the interconnect resistance are added to a net of said interconnect structure; and performing operation verification of said semiconductor device by using said CR-added netlist.

* * * * *